(12) United States Patent
Kimura et al.

(10) Patent No.: US 9,386,547 B2
(45) Date of Patent: Jul. 5, 2016

(54) SC-FDMA TRANSMISSION DEVICE AND TRANSMISSION METHOD

(75) Inventors: Ryohei Kimura, Osaka (JP); Toru Oizumi, Osaka (JP); Yoshihiko Ogawa, Kanagawa (JP); Daichi Imamura, Beijing (CN); Fumiyuki Adachi, Miyagi (JP); Tetsuya Yamamoto, Tokyo (JP)

(73) Assignee: PANASONIC CORPORATION, Osaka (JP)

( * ) Notice: Subject to any disclaimer, the term of this patent is extended or adjusted under 35 U.S.C. 154(b) by 340 days.

(21) Appl. No.: 14/241,290

(22) PCT Filed: Aug. 16, 2012

(86) PCT No.: PCT/JP2012/005167
§ 371 (c)(1),
(2), (4) Date: Feb. 26, 2014

(87) PCT Pub. No.: WO2013/031119
PCT Pub. Date: Mar. 7, 2013

(65) Prior Publication Data
US 2014/0226586 A1   Aug. 14, 2014

(30) Foreign Application Priority Data
Aug. 30, 2011   (JP) .................................. 2011-186911

(51) Int. Cl.
*H04W 4/00* (2009.01)
*H04W 52/54* (2009.01)
(Continued)

(52) U.S. Cl.
CPC .......... *H04W 52/54* (2013.01); *H03M 13/2957* (2013.01); *H03M 13/353* (2013.01);
(Continued)

(58) Field of Classification Search
USPC ........................................................ 370/329
See application file for complete search history.

(56) References Cited

U.S. PATENT DOCUMENTS

| 2007/0211667 A1* | 9/2007 | Agrawal | H04W 72/14 370/335 |
| 2009/0111477 A1* | 4/2009 | Tsutsui | H04L 1/1887 455/450 |

(Continued)

FOREIGN PATENT DOCUMENTS

| CN | 102017484 A | 4/2011 |
| WO | 2009/131156 A1 | 10/2009 |
| WO | 2011/155468 A1 | 12/2011 |

OTHER PUBLICATIONS

International Search Report for Application No. PCT/JP2012/005167 dated Oct. 23, 2012.
(Continued)

*Primary Examiner* — Gregory Sefcheck
*Assistant Examiner* — Majid Esmaeilian
(74) *Attorney, Agent, or Firm* — Pearne & Gordon LLP

(57) ABSTRACT

An SC-FDMA transmission device capable of achieving excellent error rate characteristics on any propagation channel, wherein a determination unit (151) determines the ratio of the frequency puncturing amount to the time puncturing amount in the total puncturing amount on the basis of a puncturing determination rule, and a setting unit (152) sets the time puncturing amount and the frequency puncturing amount on the basis of this ratio. Here, in the puncturing determination rule, the ratio is determined from the MCS of the encoded data, the number of resources allocated to the encoded data, and the delay spread of the propagation channel between a receiving device and the transmission device (100).

12 Claims, 17 Drawing Sheets

(51) Int. Cl.
*H03M 13/29* (2006.01)
*H03M 13/00* (2006.01)
*H03M 13/35* (2006.01)
*H04L 27/26* (2006.01)
*H04L 1/00* (2006.01)

(52) U.S. Cl.
CPC ...... *H03M13/6362* (2013.01); *H03M 13/6525* (2013.01); *H04L 1/0068* (2013.01); *H04L 27/2636* (2013.01)

(56) References Cited

U.S. PATENT DOCUMENTS

| | | | |
|---|---|---|---|
| 2009/0138785 A1* | 5/2009 | Sakai | H03M 13/1102 714/790 |
| 2010/0046390 A1* | 2/2010 | Hong | H04W 4/20 370/252 |
| 2011/0044377 A1 | 2/2011 | Ibi et al. | |
| 2013/0128834 A1 | 5/2013 | Higuchi | |

OTHER PUBLICATIONS

Koichi Tahara, et al., "Systematic-Parity Bits Separated Puncturing Method for Frequency-Domain Punctured Turbo Codes", IEICE Technical Report, RCS, Musen Tsushin System 110 (369), Jan. 13, 2011, pp. 179 to 184.

Koichi Tahara, et al., "Frequency-Domain Punctured Turbo Codes," IEICE Technical Report, RCS2010-33, Jun. 2010, pp. 91 to 96.

* cited by examiner

| TBS index | ... | $N_{PRB}$ | | ... | |
|---|---|---|---|---|---|
| | 1 | ... | 50 | ... | 110 |
| 0 | 16 | ... | 1384 | ... | 3112 |
| 1 | 14 | ... | 1800 | ... | 4008 |
| ... | ... | ... | ... | ... | ... |
| 10 | 144 | ... | 8780 | ... | 19080 |
| 11 | 176 | ... | 9912 | ... | 22152 |
| ... | ... | ... | ... | ... | ... |
| 19 | 408 | ... | 21384 | ... | 46888 |
| 20 | 440 | ... | 22920 | ... | 51024 |
| ... | ... | ... | ... | ... | ... |
| 26 | 712 | ... | 36696 | ... | 75376 |

FIG. 2B

| MCS index | MODULATION SCHEME | TBS index |
|---|---|---|
| 0 | QPSK | 0 |
| 1 | QPSK | 1 |
| ... | ... | ... |
| 10 | QPSK | 10 |
| 11 | 16QAM | 10 |
| ... | ... | ... |
| 20 | 16QAM | 19 |
| 21 | 64QAM | 19 |
| ... | ... | ... |
| 28 | 64QAM | 26 |

FIG. 2A

| TOTAL AMOUNT OF PUNCTURING $N_p$ | |
|---|---|
| AMOUNT OF TIME PUNCTURING $N_t$ | AMOUNT OF FREQUENCY PUNCTURING $N_f$ |

FIG. 4

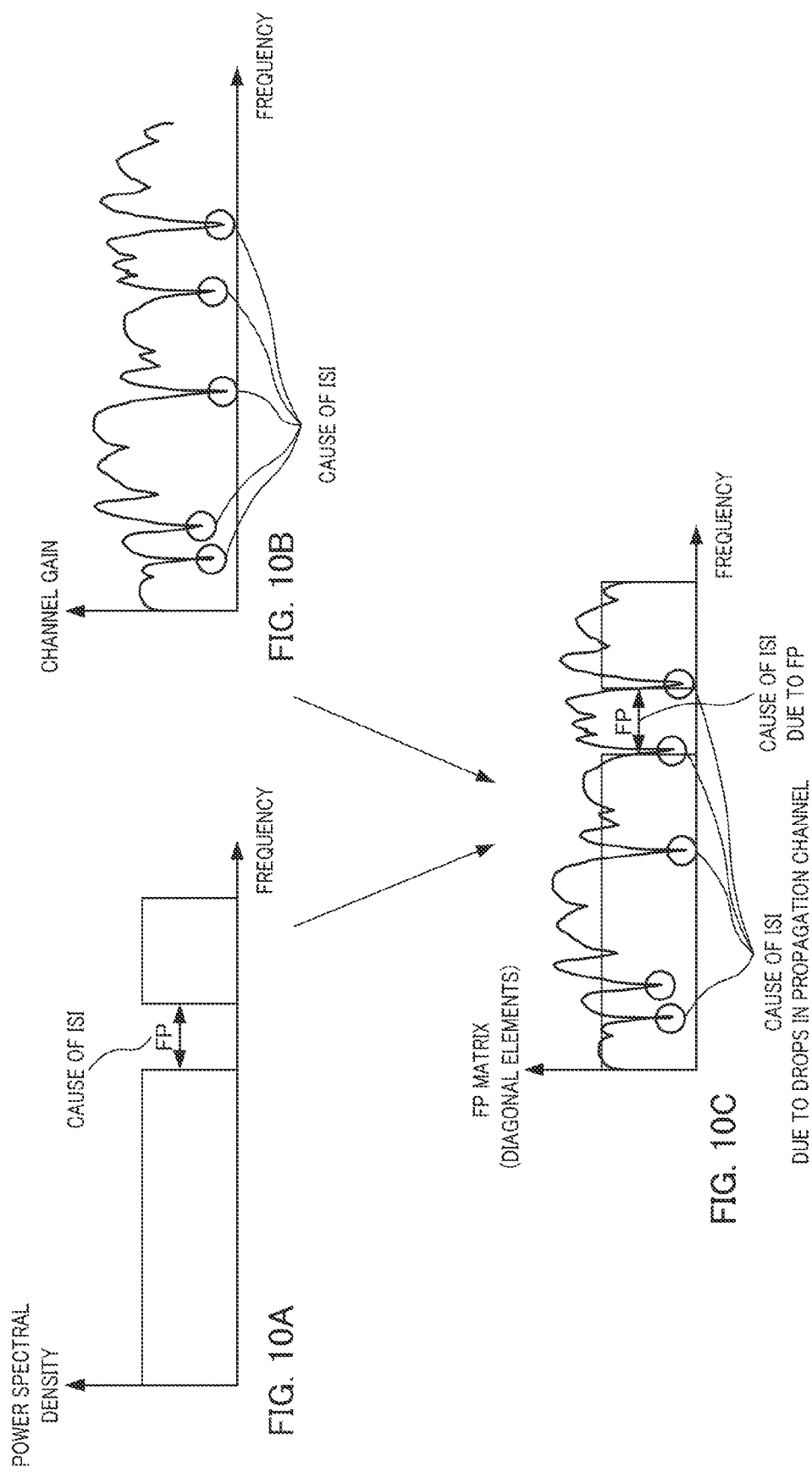

| | | TP ONLY | (TP +) FP REQUIRED |
|---|---|---|---|
| DELAY SPREAD | LARGE | YES | NO |
| | SMALL | NO | YES |
| ALLOCATED BANDWIDTH (THE NUMBER OF ALLOCATED RBs) | WIDE | YES | NO |
| | NARROW | NO | YES |
| CODE RATE R | HIGH | NO | YES |
| | LOW | YES | NO |

FIG. 11

| MCS index | | $N_{PRB}$ | | | | | |
|---|---|---|---|---|---|---|---|
| | 1 | | ... | 50 | | ... | 110 |
| | FP INDEX | | | | | | |
| | 0 | 1 | | 0 | 1 | | 0 | 1 |
| 0 (QPSK) | (0.2, 0.3) | | ... | (0.1, 0.2) | | ... | (0.0, 0.1) |
| 1 (QPSK) | (0.3, 0.4) | | ... | (0.2, 0.3) | | ... | (0.1, 0.2) |
| ... | ... | | ... | ... | | ... | ... |
| 10 (QPSK) | (0.7, 0.9) | | ... | (0.6, 0.8) | | ... | (0.5, 0.7) |
| 11 (16QAM) | (0.2, 0.2) | | ... | (0.1, 0.2) | | ... | (0.0, 0.0) |
| ... | ... | | ... | ... | | ... | ... |
| 19 (16QAM) | (0.6, 0.8) | | ... | (0.5, 0.7) | | ... | (0.4, 0.6) |
| 20 (64QAM) | (0.0, 0.0) | | ... | (0.0, 0.0) | | ... | (0.0, 0.0) |
| ... | ... | | ... | ... | | ... | ... |
| 26 (64QAM) | (0.5, 0.7) | | ... | (0.4, 0.6) | | ... | (0.3, 0.5) |

CANDIDATES OF FREQUENCY PUNCTURING RATE $R_f$

FIG. 12

(THE NUMBER OF CLUSTERS : 2)

(THE NUMBER OF CLUSTERS : 4)

| MCS index | $N_{PRB}$ | | | | | |
|---|---|---|---|---|---|---|
| | 1 | | ... | 50 | ... | 110 |
| | FP INDEX 0 | 1 | | 0 | 1 | 0 | 1 |
| 0 | (0.3, 0.4) | | ... | (0.2, 0.3) | ... | (0.1, 0.2) |
| 1 | (0.4, 0.5) | | ... | (0.3, 0.4) | ... | (0.2, 0.3) |
| ... | ... | | ... | ... | ... | ... |
| 10 | (0.8, 0.9) | | ... | (0.7, 0.9) | ... | (0.6, 0.8) [CANDIDATES OF FREQUENCY PUNCTURING RATE $R_f$] |
| 11 | (0.3, 0.3) | | ... | (0.2, 0.3) | ... | (0.1, 0.1) |
| ... | ... | | ... | ... | ... | ... |
| 19 | (0.7, 0.9) | | ... | (0.6, 0.8) | ... | (0.5, 0.7) |
| 20 | (0.1, 0.1) | | ... | (0.1, 0.1) | ... | (0.1, 0.1) |
| ... | ... | | ... | ... | ... | ... |
| 26 | (0.6, 0.8) | | ... | (0.5, 0.7) | ... | (0.4, 0.6) |

QPSK: MCS 0–10
16QAM: MCS 11–19
64QAM: MCS 20–26

FIG. 17

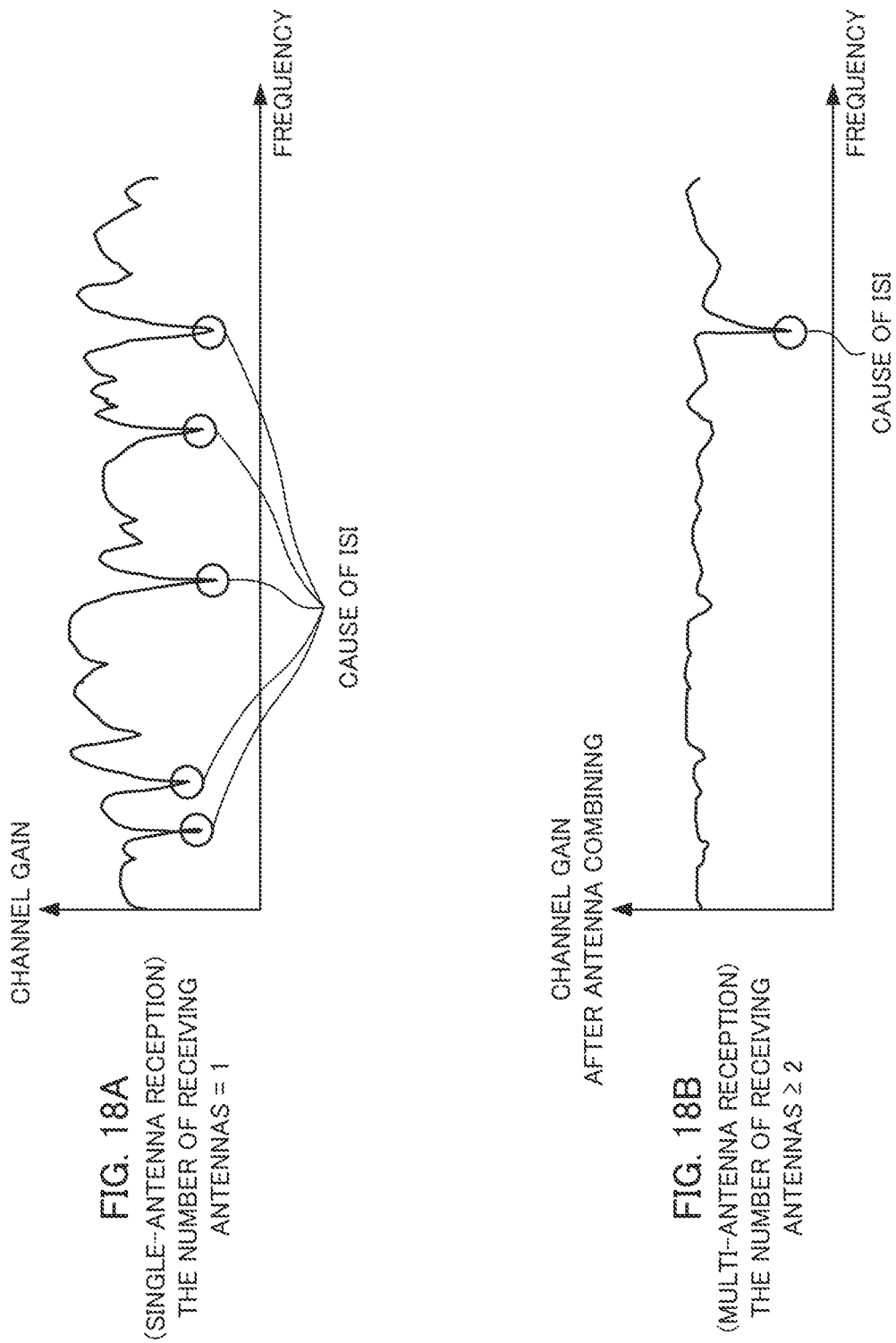

SC-FDMA TRANSMISSION DEVICE AND TRANSMISSION METHOD

TECHNICAL FIELD

The present invention relates to a transmission apparatus and a transmission method.

BACKGROUND ART

3GPP LTE (3rd Generation Partnership Project Long Term Evolution) employs SC-FDMA (Single Carrier-Frequency Division Multiple Access) as its uplink access scheme. SC-FDMA features a low PAPR (Peak to Average Power Ratio) achieved by the single-carrier scheme of SC-FDMA, flexible allocation of data to sub-carrier frequencies, resilience to multipath interference in frequency-domain signal processing on the receiving side, and the like.

In SC-FDMA, on the transmitting side, SC-FDMA signals are generated, for example, by converting time-domain symbols into frequency components by a DFT (Discrete Fourier Transform), mapping the frequency components to respective different sub-carriers, then, converting the mapped frequency components back into time-domain waveform by an IDFT (Inverse Discrete Fourier Transform), and adding a CP (Cyclic Prefix) to the time-domain signal. Correspondingly, on the receiving side, the time-domain signal is recovered by converting a time-domain signal from the transmitting side into frequency components by a DFT, performing frequency equalization processing on the frequency components, and performing an IDFT on the signals after the frequency equalization processing. As described above, in SC-FDMA, the DFT on the transmitting side (hereinafter referred to as a transmitting DFT) corresponds to the IDFT on the receiving side (hereinafter referred to as a receiving IDFT), and the IDFT on the transmitting side (hereinafter referred to as a transmitting IDFT) corresponds to the DFT on the receiving side (hereinafter referred to as a receiving DFT).

As a new control scheme for the code rate of turbo coding, puncturing in the frequency domain (frequency puncturing, which may hereinafter be abbreviated as FP) has been drawing a lot of attention (see NPL 1 and NPL 2, for example). The frequency puncturing is a puncturing scheme which is essentially used in SC-FDMA systems, and in which puncturing is performed on frequency-domain signals after the transmitting DFT.

Operations of the frequency puncturing and puncturing in the time domain (time puncturing, which may hereinafter be abbreviated as TP), which is the conventional control scheme for the code rate of turbo coding will be described below (see FIG. 1).

In the time puncturing, puncturing is performed on encoded bits in the time-domain immediately after turbo coding (i.e., before the transmitting DFT) on a bit basis. For example, in FIG. 1, the last two bits are punctured (thinned) among ten encoded bits. In contrast, in the frequency puncturing, puncturing is performed on puncturing target data in which the encoded bits are convoluted into a plurality of symbols in the frequency domain, on a symbol basis. For example, in FIG. 1, the two symbols that are highest in frequency are punctured (thinned) among eight symbols mapped to eight sub-carriers. Thus, in the time puncturing, the whole of some encoded bits (or symbols) in the time domain are completely punctured. In contrast, in the frequency puncturing, some components of each encoded bit are punctured to a similar extent respectively. In other words, contrary to the time puncturing, in the frequency puncturing, the whole of some encoded bits are not completely punctured.

In consequence, assuming that transmission power is the same (i.e., the power corresponding to the punctured components is the same), the frequency puncturing allows for more parity bits per transmission than the time puncturing. The frequency puncturing may therefore improve an error correction coding gain as compared to the time puncturing by an increase in the number of transmitted parity bits. However, since the total punctured transmission power is the same in the time puncturing and the frequency puncturing if the transmission power is the same, the transmission power for each bit of a signal after the frequency puncturing is less than that of a signal after the time puncturing.

In the frequency puncturing, some frequency components of each encoded bit are punctured between the transmitting DFT and the receiving IDFT (i.e., after the transmitting DFT and before the receiving IDFT). This deteriorates unitarity (orthogonality) between the DFT matrix used in the transmitting DFT and the IDFT matrix used in the receiving IDFT, resulting in inter-symbol interference. In contrast, in the time puncturing, some encoded bits are punctured before the transmitting DFT. Thus, the unitarity is retained between the DFT matrix used in the transmitting DFT and the IDFT matrix used in the receiving IDFT.

As described above, in the frequency puncturing and the time puncturing, there is a trade-off between "improving the error correction coding gain by an increase of the number of parity bits" and "retaining the unitarity between the DFT matrix on the transmitting side and the IDFT matrix on the receiving side."

For example, in LTE, the number of bits punctured by the time puncturing (the number of punctures) N is calculated by the following expression 1:

[1]

Number of Punctures $N$=(TBS÷Code Rate $Ro$)−
(Modulation Level×Number of Allocated $RBs$
$N_{PRB}$×Number of Sub-Carriers per Allocated
$RB$×Number of SC-FDMA Symbols in Subframe)     (Expression 1)

In expression 1, TBS stands for Transport Block Size and denotes the number of bits input to a turbo coder. The code rate (original code rate) Ro is a code rate before puncturing. For example, in 3GPP LTE-Advanced (hereinafter referred to as LTE-Advanced), which enables faster communication than LTE, Ro=⅓. The number of allocated RBs $N_{PRB}$ denotes the number of RBs that are allocated to data to be transmitted.

For example, in LTE-Advanced, the code rate Ro, the number of SC-FDMA symbols in a subframe, and the number of sub-carriers per allocated RB used in expression 1 are predetermined by a system. In contrast, the TBS, modulation level, and the number of allocated RBs $N_{PRB}$ used in expression 1 are determined by a base station for each subframe and indicated to a terminal via a downlink control channel.

In LTE-Advanced, two tables shown in FIG. 2A and FIG. 2B are used to determine the TBS. FIG. 2A is a table that shows a relationship between the MCS (Modulation and Coding Scheme) index and the TBS index, and FIG. 2B is a table that shows a relationship between the TBS index, the number of allocated RBs $N_{PRB}$, and the TBS. For example, the tables shown in FIG. 2A and FIG. 2B are shared between the base station and the terminal.

At first, the base station determines the MCS index and the number of allocated RBs $N_{PRB}$ depending on a received SINR, an amount of data of the terminal that requests data transmission and the like. The base station indicates the determined MCS index and the number of allocated RBs $N_{PRB}$ to the terminal. The base station and the terminal then determine the modulation scheme and the TBS index from the MCS index in reference to the table shown in FIG. 2A. Next, the base station and the terminal determine the TBS from the TBS index and the number of allocated RBs $N_{PRB}$ in reference to the table shown in FIG. 2B.

For example, the case where the MCS index is 11 and the number of allocated RBs $N_{PRB}$ is 50 will be described. The modulation scheme: 16-QAM and the TBS index=10, which corresponds to the MCS index=11, are determined first in reference to FIG. 2A. The TBS=8760, which corresponds to the TBS index=10 and the number of allocated RBs $N_{PRB}$=50, is determined next in reference to FIG. 2B.

In this way, since the tables shown in FIG. 2A and FIG. 2B are shared between the base station and the terminal, the terminal can determine the TBS for the terminal when the base station feeds back only the MCS index and the number of allocated RBs $N_{NRB}$ to the terminal. In consequence, the terminal can determine all the parameters used for calculating the number of punctures N by expression 1.

PTL 2 describes the fact that the combination of time puncturing and frequency puncturing can provide better error rate performances than the time puncturing alone in a static (AWGN (Additive White Gaussian Noise)) channel. In contrast, PTL 2 also describes the fact that the combination of time puncturing and frequency puncturing may provide worse error rate performances than the time puncturing alone in a multipath fading channel.

As a related art to improve efficiency in the use of frequency resources, clustered SC-FDMA has been proposed. In clustered SC-FDMA, SC-FDMA symbols are divided into a plurality of clusters and the plurality of clusters are mapped to frequency resources. Each cluster includes a plurality of RBs (Resource Blocks). In clustered SC-FDMA, a base station determines a cluster size (the number of symbols included in a cluster) and cluster-allocated positions and indicates the determined information to a terminal via a downlink control channel. For example, the base station sets resources having a high average received SINR (Signal to Interference and Noise Ratio) as the cluster-allocated positions in the frequency domain. In contrast, the terminal determines the number of symbols corresponding to the cluster size indicated via the downlink control channel as the number of symbols that are input to the DFT (transmitting DFT). The terminal then maps clusters including the symbols after the DFT to the respective allocated positions indicated via the downlink control channel. The mapped clusters are transmitted after the IDFT.

CITATION LIST

Non-Patent Literature

NPL 1
K. Tahara, K. Higuchi, "Frequency-Domain Punctured Turbo Codes," IEICE Technical Report, RCS2010-33, 2010-6, pp. 91-96
NPL 2
K. Tahara, K. Higuchi, "Systematic-Parity Bits Separated Puncturing Method for Frequency-Domain Punctured Turbo Codes," IEICE Technical Report, RCS2010-229, 2011-1, pp. 179-184

SUMMARY OF INVENTION

Technical Problem

The frequency puncturing may be applied to the above-described clustered SC-FDMA in order to allocate clusters to frequency resources having a high channel gain.

In particular, FIG. 3 illustrates an exemplary configuration of a terminal in a system in which the frequency puncturing is applied to clustered SC-FDMA. As shown in FIG. 3, the frequency puncturing (FP) has a function of determining (selecting) symbols to be transmitted (or symbols to be thinned) and a function of mapping the symbols to bands (allocated bands) that are used for transmission. When the terminal executes these functions, as shown in FIG. 3, the terminal thins out symbols, the number of which corresponds to the number of punctures N (four in FIG. 3) calculated by expression 1, from symbols output from the DFT (transmitting DFT). The terminal then maps the symbols after the puncturing to the allocated bands (allocated positions) indicated by a base station.

In this way, clusters are mapped to bands having a good channel quality (for example, SINR) by applying the frequency puncturing to clustered SC-FDMA. This may reduce an effect of the deterioration of error rate performances due to the frequency puncturing applied in a multipath fading channel as described above.

However, the cluster size is determined depending not only on the SINR of RBs to which clusters are mapped respectively, but also on the size of the whole data. As a result, the symbols to be transmitted may not be mapped to clusters having a high SINR. This may result in deterioration of SINR performances, i.e., drops in the channel gain in each cluster. In particular, since the drops in the channel gain is more likely to occur in a multipath fading channel, the application of the frequency puncturing to clustered SC-FDMA in such a channel may cause deterioration of the error rate performances in each cluster.

An object of the present invention is to provide an SC-FDMA transmission apparatus and an SC-FDMA transmission method that can achieve good error rate performances in any propagation channel.

Solution to Problem

An SC-FDMA transmission apparatus according to an aspect of the present invention is a transmission apparatus that performs time puncturing and frequency puncturing, the time puncturing being performed on bits of encoded data on a per bit basis in a time domain, the frequency puncturing being performed, on a per symbol basis, on the encoded data in which bits are convoluted into a plurality of symbols in a frequency domain, the transmission apparatus including: a determination section that determines, according to a puncturing determination rule, a ratio between a first amount of electric power corresponding to a bit that is punctured by the time puncturing and a second amount of electric power corresponding to a symbol that is punctured by the frequency puncturing in a total amount of electric power corresponding to components of the encoded data, the components being punctured by the time puncturing and the frequency puncturing; a setting section that sets the first amount of electric power and the second amount of electric power based on the ratio; a first puncturing section that performs the time puncturing on the encoded data according to the first amount of electric power; and a second puncturing section that performs the frequency puncturing on the encoded data after the time puncturing, according to the second amount of electric power, in which the ratio is identified according to the puncturing determination rule based on an MCS (Modulation and Coding Scheme) for the encoded data, a number of resources allocated to the encoded data, and a delay spread of a propagation channel between a reception apparatus and the transmission apparatus.

A transmission method according to an aspect of the present invention is a transmission method in which time puncturing and frequency puncturing are performed, the time puncturing being performed on bits of encoded data on a per bit basis in a time domain, the frequency puncturing being performed, on a per symbol basis, on the encoded data in which bits are convoluted into a plurality of symbols in a frequency domain, the transmission method including: determining, according to a puncturing determination rule, a ratio between a first amount of electric power corresponding to a bit that is punctured by the time puncturing and a second amount of electric power corresponding to a symbol that is punctured by the frequency puncturing in a total amount of electric power corresponding to components of the encoded data, the components being punctured by the time puncturing and the frequency puncturing; setting the first amount of electric power and the second amount of electric power based on the ratio; performing the time puncturing on the encoded data according to the first amount of electric power; and performing the frequency puncturing on the encoded data after the time puncturing, according to the second amount of electric power, in which the ratio is determined according to the puncturing determination rule based on an MCS (Modulation and Coding Scheme) for the encoded data, a number of resources allocated to the encoded data, and a delay spread of a propagation channel between a reception apparatus and a transmission apparatus.

Advantageous Effects of Invention

According to the present invention, good error rate performances can be achieved in any propagation channel.

BRIEF DESCRIPTION OF DRAWINGS

FIGS. 2A and 2B show a relationship between the MCS, TBS, and the number of allocated RBs;

FIG. 4 illustrates a relationship between a total amount of puncturing, an amount of time puncturing, and an amount of frequency puncturing according to embodiments of the present invention;

FIGS. 10A to 10C illustrate an example of causes of ISI;

FIG. 11 is a table that shows whether or not the frequency puncturing can be applied according to Embodiment 1 of the present invention;

FIG. 12 shows a frequency puncturing determination table according to Embodiment 1 of the present invention;

FIG. 17 shows a frequency puncturing determination table according to Embodiment 2 of the present invention; and FIGS. 18A and 18B illustrate the channel gain corresponding to the number of receiving antennas of a reception apparatus according to Embodiment 3 of the present invention.

DESCRIPTION OF EMBODIMENTS

Figure 1:
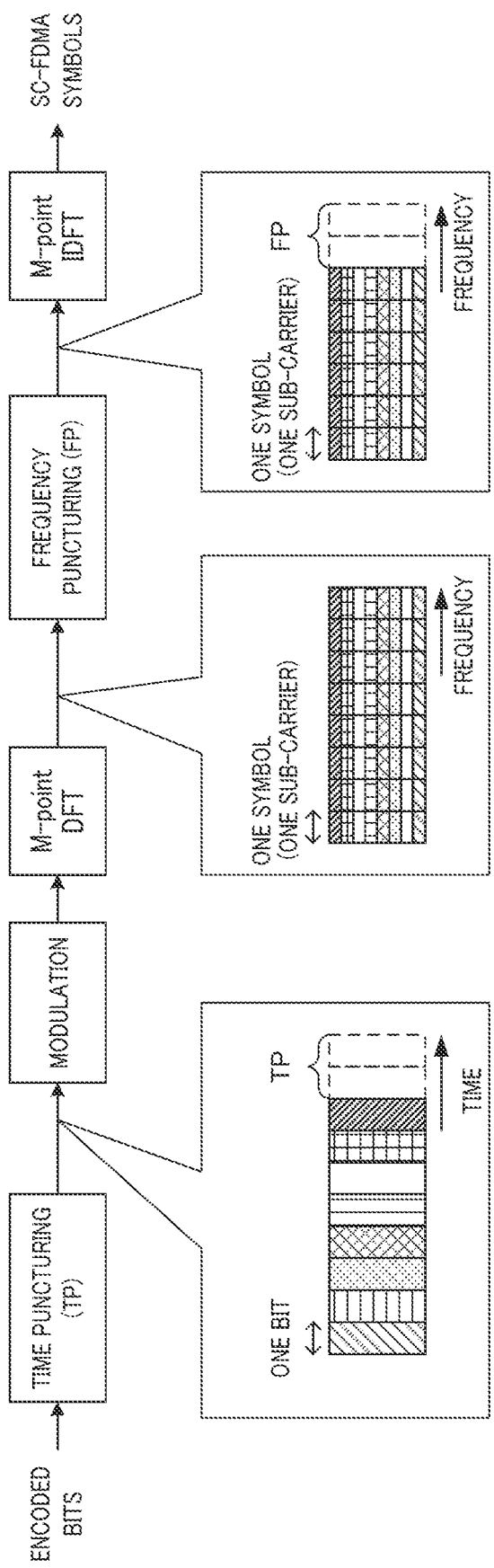
FIG. 1 illustrates the time puncturing and the frequency puncturing, respectively.
Figure 3:
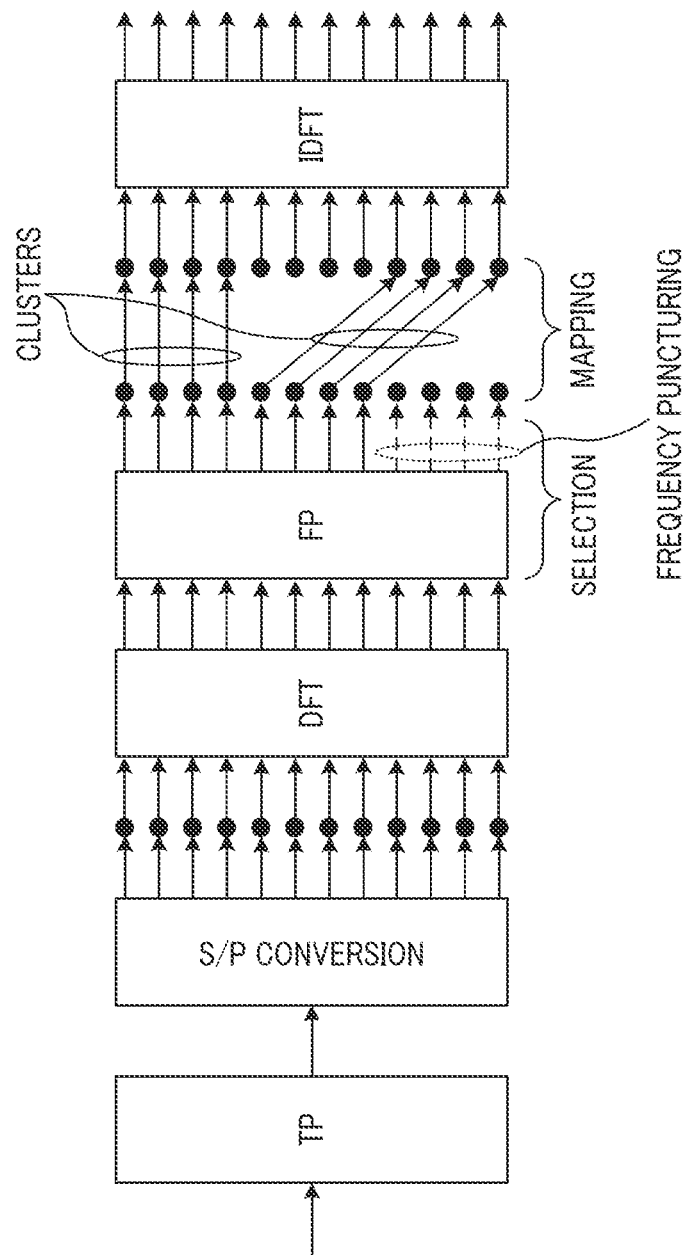
FIG. 3 illustrates clustered SC-FDMA to which the frequency puncturing is applied.

Embodiments of the present invention will be described in detail below in reference to the accompanying drawings. In the embodiments, the same components are denoted by the same reference character, and the description of those components is not repeated for conciseness.

In the following description, a transmission apparatus (SC-FDMA apparatus) according to each embodiment is a terminal, and a reception apparatus according to each embodiment is a base station, for example.

In the following description, the transmission apparatus according to each embodiment performs time puncturing (TP) and frequency puncturing (FP). In the time puncturing (TP), bits of encoded data are punctured on a per bit basis in the time domain. In the frequency puncturing (FP), puncturing target data in which the bits are convoluted into a plurality of symbols in the frequency domain is punctured on a per symbol basis.

In the following description, as shown in FIG. 4, an amount of time puncturing $N_t$ is defined as an amount of electric power corresponding to bits that are punctured by the time puncturing, and an amount of frequency puncturing $N_f$ is defined as an amount of electric power corresponding to symbols that are punctured by the frequency puncturing. In addition, as expressed by expression 2, a total amount of puncturing (total amount of electric power) $N_P$ is defined as a sum of the amount of time puncturing $N_t$ and the amount of frequency puncturing $N_f$. Furthermore, a frequency puncturing rate $R_f$ is defined as a ratio of the amount of frequency puncturing $N_f$ to the total amount of puncturing $N_P$ as expressed by expression 3. Thus, in the following, a description will be provided for the case where the frequency puncturing rate $R_f$ represents a ratio between the amount of time puncturing $N_t$ and the amount of frequency puncturing $N_f$ in the total amount of puncturing $N_P$.

(Expression 2)
$$N_P = N_t + N_f \quad [2]$$

(Expression 3)
$$\text{Frequency Puncturing Rate } R_f = \frac{\text{Amount of Frequency Puncturing } N_f}{\text{Total Amount of Puncturing } N_P} \quad [3]$$

Embodiment 1

Figure 5:
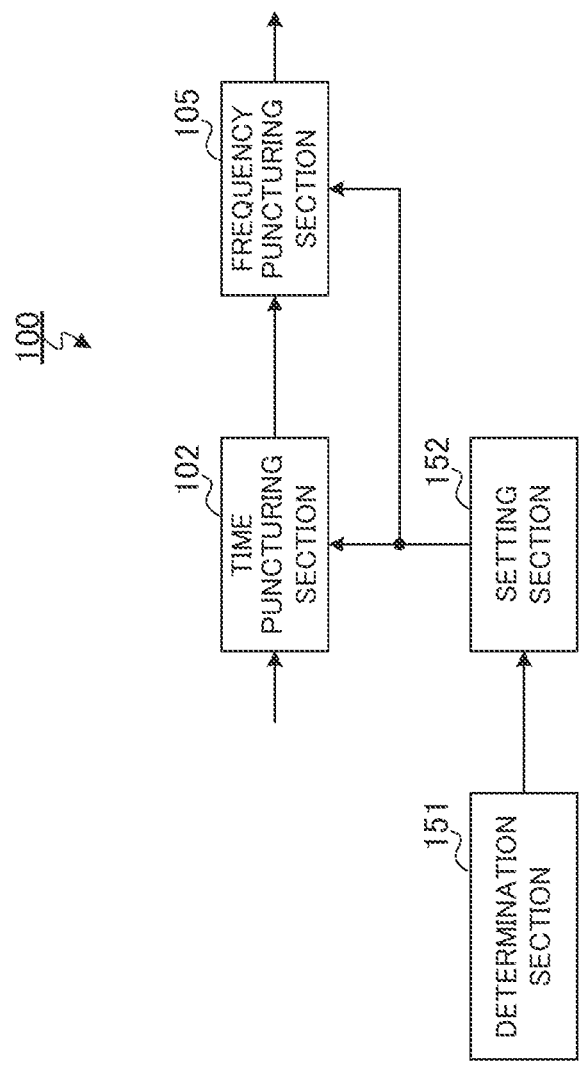
FIG. 5 is a block diagram that illustrates major components of a transmission apparatus according to Embodiment 1 of the present invention.

FIG. 5 illustrates major components of transmission apparatus 100 according to the present embodiment. Transmission apparatus 100 shown in FIG. 5 performs the time puncturing and the frequency puncturing. In transmission apparatus 100, determination section 151 determines, according to puncturing determination rules, a ratio between the amount of time puncturing and the amount of frequency puncturing in the total amount of puncturing corresponding to components of encoded data that are punctured in the time puncturing and the frequency puncturing; setting section 152 sets the amount of time puncturing and the amount of frequency puncturing based on the above-mentioned ratio; time puncturing section 102 performs the time puncturing on the encoded data according to the amount of time puncturing; and frequency puncturing section 105 performs the frequency puncturing on the encoded data after the time puncturing according to the amount of frequency puncturing. In this process, according to the above-mentioned puncturing determination rules, the above-mentioned ratio is determined based on an MCS for the encoded data, the number of resources allocated to the encoded data, and a delay spread of a propagation channel between a reception apparatus and transmission apparatus 100.

Figure 6:
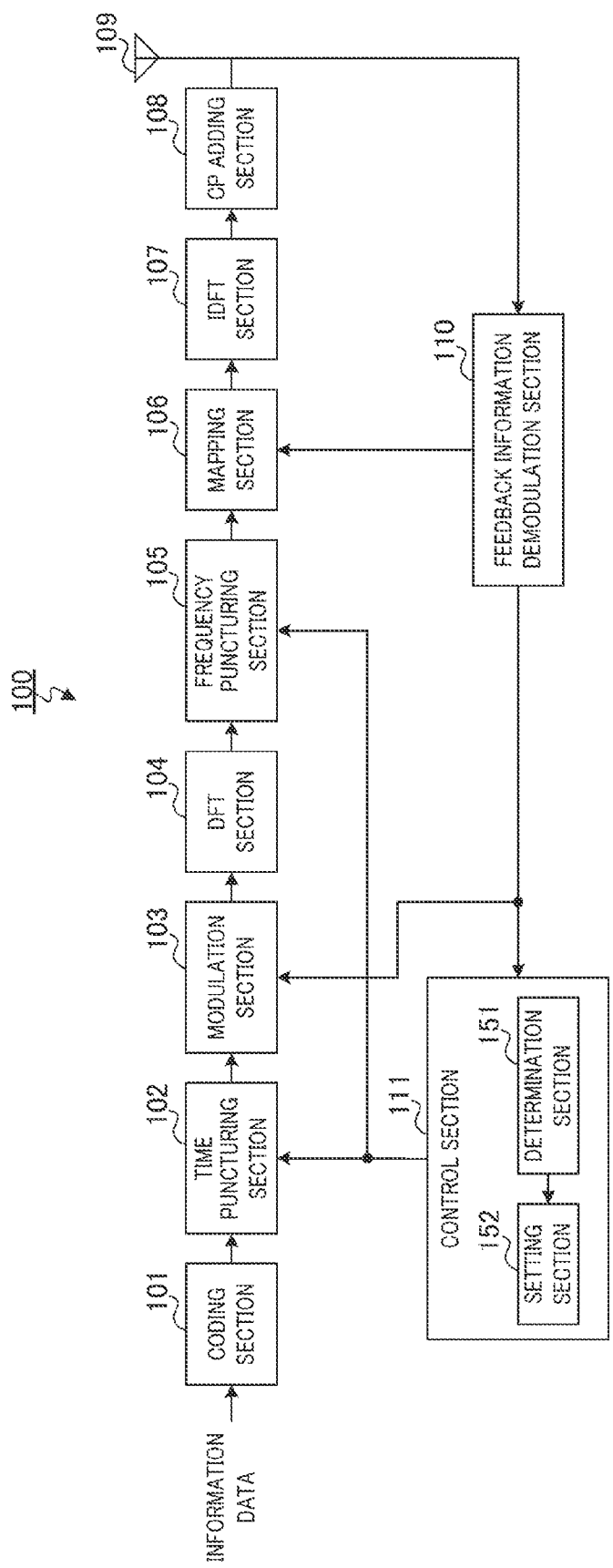
FIG. 6 is a block diagram that illustrates a configuration of the transmission apparatus according to Embodiment 1 of the present invention.

FIG. 6 is a block diagram that illustrates a configuration of the transmission apparatus according to the present embodiment.

Coding section 101 performs coding (for example, turbo coding) on information data and generates encoded bits. The encoded bits include systematic bits (information data itself) and parity bits (redundant data). Coding section 101 outputs the generated encoded bits to time puncturing section 102.

Time puncturing section 102 has a CB (Circular Buffer) and stores the encoded bits input from coding section 101. The amount of time puncturing $N_t$ is also input from control section 111, which will be described below, to time puncturing section 102. Time puncturing section 102 performs the time puncturing on the encoded bits according to the amount of time puncturing $N_t$. In other words, time puncturing section 102 thins out bits the number of which corresponds to the amount of time puncturing $N_t$ from the encoded bits stored in the CB. In this way, time puncturing section 102 extracts data on a per transmission basis from among the encoded bits stored in the CB. That is, the time puncturing (puncturing on a per bit basis) is equivalent to extraction processing on a per bit basis. Time puncturing section 102 outputs the extracted encoded bits to modulation section 103.

Modulation section 103 generates modulated symbols by digitally modulating the encoded bits input from time puncturing section 102 according to a modulation level input from feedback information demodulation section 110. Modulation section 103 outputs the generated modulated symbols to DFT section 104.

DFT section 104 performs DFT processing (the transmitting DFT) on the modulated symbols input from modulation section 103 to convert the time-domain signal to frequency-domain signals (symbols). DFT section 104 outputs the modulated symbols after the DFT to frequency puncturing section 105.

The amount of frequency puncturing $N_f$ is input from control section 111 to frequency puncturing section 105. Frequency puncturing section 105 performs the frequency puncturing on the modulated symbols in the frequency domain input from DFT section 104 according to the amount of frequency puncturing $N_f$. Frequency puncturing section 105 then outputs the modulated symbols after the frequency puncturing to mapping section 106.

Mapping section 106 maps the modulated symbols input from frequency puncturing section 105 to frequency resources indicated in allocated-band information (allocated-cluster information) input from feedback information demodulation section 110. Thus, mapping section 106 maps a plurality of clusters, which are generated by dividing the symbols after the frequency puncturing, to allocated positions indicated in the allocated-band information. Mapping section 106 outputs the modulated symbols mapped to the frequency resources to IDFT section 107.

IDFT section 107 performs IDFT processing (the transmitting IDFT) on the modulated symbols (in the frequency domain) input from mapping section 106 to convert the frequency-domain signal into a time-domain signal. At this point, IDFT section 107 allocates zero to the frequency-punctured frequency resources (sub-carriers) (zero padding) to perform the IDFT. IDFT section 107 outputs the signal (in the time domain) after the IDFT to CP (Cyclic Prefix) adding section 108.

Pilot signals (reference signals, not shown) and the modulated symbols (i.e., the data signals) from IDFT section 107 are input to CP adding section 108. CP adding section 108 prepends as a CP to a multiplexed signal, which is generated by multiplexing the pilot signals and the modulated symbols, a signal that is identical to the end portion of the multiplexed signal, thereby generating an SC-FDMA signal. The generated SC-FDMA signal is transmitted via antenna 109.

Feedback information demodulation section 110 receives feedback information transmitted from reception apparatus 200, which will be described below (FIG. 7), via antenna 109, and demodulates the received feedback information.

Feedback information includes information indicating whether a retransmission is performed or not, an MCS index, the number of allocated RBs $N_{PRB}$, allocated-band information indicating positions to which data to be transmitted allocated, and an FP index associated with a frequency puncturing rate. The FP index is feedback information generated based on a delay spread of a propagation channel between transmission apparatus 100 and reception apparatus 200. Feedback information demodulation section 110 outputs a modulation level (modulation scheme) identified by an MCS index in reference to the table shown in FIG. 2A, for example, to modulation section 103. Feedback information demodulation section 110 also outputs the allocated-band information to mapping section 106. Feedback information demodulation section 110 further outputs the MCS index, the number of allocated RBs $N_{PRB}$, and the FP index to control section 111.

Control section 111 is configured to include determination section 151 and setting section 152.

Determination section 151 uses the information input from feedback information demodulation section 110 to determine a ratio between the amount of time puncturing $N_t$ and the amount of frequency puncturing $N_f$ in the total amount of puncturing $N_P$ according to the puncturing determination rules. For example, determination section 151 uses the MCS (the code rate and the modulation scheme), the number of allocated RBs $N_{PRB}$, and the FP index to determine the frequency puncturing rate $R_f$ in reference to the frequency puncturing determination rules. That is, according to the puncturing determination rules, the frequency puncturing rate $R_f$ (a ratio between the amount of time puncturing $N_t$ and the amount of frequency puncturing $N_f$) is determined based on an MCS (a code rate and a modulation scheme) for the encoded data, the number of resources allocated to the encoded data, and a delay spread of a propagation channel between reception apparatus 200 and transmission apparatus 100. However, the above-mentioned delay spread is calculated in reception apparatus 200 (for example, a base station), but may not be fed back via a downlink control channel, for example. Transmission apparatus 100 (for example, a terminal) may not therefore know the delay spread itself. In this case, determination section 151 determines the frequency puncturing rate $R_f$ by using the MCS index, the number of allocated RBs $N_{PRB}$, and the FP index (information generated based on the delay spread between reception apparatus 200 and transmission apparatus 100) fed back, for example, via a downlink control channel from reception apparatus 200 and the frequency puncturing determination rules maintained in determination section 151. Thus, transmission apparatus 100 can perform determination processing of the frequency puncturing rate $R_f$ based on the above-mentioned delay spread even when the delay spread itself is not fed back. Determination section 151 outputs the determined frequency puncturing rate $R_f$ (a ratio between $N_t$ and $N_f$) to setting section 152.

Setting section 152 determines the amount of frequency puncturing $N_f$ and the amount of time puncturing $N_t$ based on the frequency puncturing rate $R_f$ determined by determination section 151. For example, setting section 152 calculates the amount of frequency puncturing $N_f$ first based on the total amount of puncturing $N_P$ and the frequency puncturing rate $R_f$ according to expression 4. Setting section 152 calculates the amount of time puncturing $N_t$ next based on the total amount of puncturing $N_P$ and the amount of frequency puncturing $N_f$ according to expression 4. Setting section 152 outputs the amount of time puncturing $N_t$ to time puncturing section 102 and outputs the amount of frequency puncturing $N_f$ to frequency puncturing section 105.

(Expression 4)

$$\begin{cases} N_f = N_P \times R_f \\ N_t = N_P - N_f \end{cases} \quad [4]$$

Control section 111 also performs retransmission control of data to be transmitted according to the information indicating whether a retransmission is performed or not in the feedback information.

Figure 7:
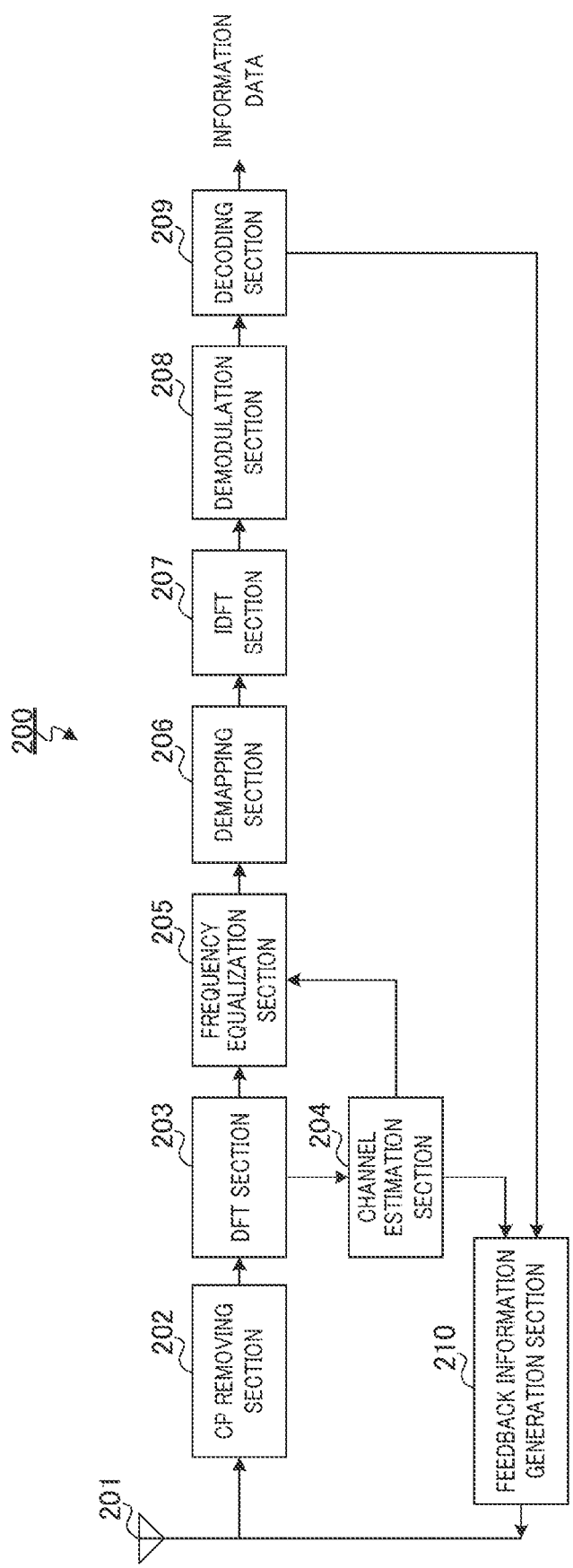
FIG. 7 is a block diagram that illustrates a configuration of a reception apparatus according to Embodiment 1 of the present invention.

FIG. 7 is a block diagram that illustrates a configuration of the reception apparatus according to the present embodiment.

In reception apparatus 200 shown in FIG. 7, CP removing section 202 receives an SC-FDMA signal (analog signal) transmitted from transmission apparatus 100 (FIG. 6) via antenna 201, and removes the CP from the received SC-FDMA signal.

DFT section 203 performs DFT processing (the receiving DFT) on the received signal (in the time domain) input from CP removing section 202 to convert the time-domain signal to frequency-domain signals. Then, DFT section 203 outputs the signals after the DFT, i.e., the frequency-domain signals to channel estimation section 204 and frequency equalization section 205.

Channel estimation section 204 performs channel estimation by means of pilot signals included in the frequency-domain signal input from DFT section 203. Two types of pilot signals, for example, SRS (Sounding Reference Signal) and DMRS (DeModulation Reference Signal), are used for the channel estimation in channel estimation section 204. SRSs are mapped over all transmission bands of transmission apparatus 100, and used by reception apparatus 200 (feedback information generation section 210, which will be described below) to determine resource allocation (cluster allocation) to each transmission apparatus 100, for example. In contrast, DMRSs are mapped in resources (clusters) allocated to transmission apparatus 100 and used for demodulation processing of transmitted signals from each transmission apparatus 100.

Channel estimation section 204 therefore outputs channel estimation values obtained by means of DMRSs to frequency equalization section 205 and outputs channel estimation values obtained by means of SRSs to feedback information generation section 210. In addition, channel estimation section 204 may use SRSs to estimate the average SINR of each RB over all the transmission bands and output estimation results to feedback information generation section 210.

Frequency equalization section 205 performs frequency equalization on data signals included in the frequency-domain signals input from DFT section 203 by using the channel estimation values input from channel estimation section 204. For example, frequency equalization section 205 uses the channel estimation values to generate frequency equalization weighting for frequency equalization processing, and multiplies sub-carriers to which the data signals (symbols) are assigned by the frequency equalization weighting, thereby removing the effect of interference (for example, multipath fading). Frequency equalization section 205 outputs the data signals after the frequency equalization to demapping section 206.

Demapping section 206 demaps (extracts) clusters allocated to the frequency resources used by the target apparatus (transmission apparatus 100) from data signals (modulated symbols in the frequency domain) input from frequency equalization section 205 based on allocated-band information input from a control section, which is not shown. Demapping section 206 outputs the signals after the demapping to IDFT section 207.

IDFT section 207 performs IDFT processing (the receiving IDFT) on the data signals (modulated symbols in the frequency domain) input from demapping section 206 to convert the frequency-domain signals to a time-domain signal. IDFT section 207 then outputs the time-domain signal to demodulation section 208.

Demodulation section 208 performs demodulation processing (for example, soft decision processing in the IQ plane) on the signal input from IDFT section 207 and outputs the signal after the demodulation (for example, soft decision bits) to decoding section 209.

Decoding section 209 decodes (for example, turbo-decodes) the signal input from demodulation section 208 and outputs the signal after the decoding as received data (information data). Also, decoding section 209 outputs a result of decoding (whether the decoding succeeded or not) to feedback information generation section 210.

Feedback information generation section 210 determines an MCS for data to be transmitted from transmission apparatus 100 and allocated positions of data to be transmitted based on the channel estimation values input from channel estimation section 204. Feedback information generation section 210 also calculates a delay spread of a propagation path (channel) between transmission apparatus 100 and reception apparatus 200 based on the channel estimation values. Feedback information generation section 210 then generates an FP index, which is information associated with a frequency puncturing rate, based on the calculated delay spread. The FP index is information which is determined depending on the magnitude of the delay spread for the same MCS and the same number of allocated RBs $N_{PRB}$ set at transmission apparatus 100, for example, and which indicates one frequency puncturing rate $R_f$ among a plurality of candidates.

Feedback information generation section 210 also generates information on whether a retransmission is performed or not (i.e., ACK/NACK information) based on the results of decoding input from decoding section 209. Feedback information generation section 210 generates feedback information that includes an indication as to whether a retransmission is performed or not, an MCS index indicating an MCS, allocated-band information indicating allocated positions, and the FP index, and transmits the feedback information to transmission apparatus 100 via antenna 201.

Operation of transmission apparatus 100 (FIG. 6) will now be described.

Figure 8:
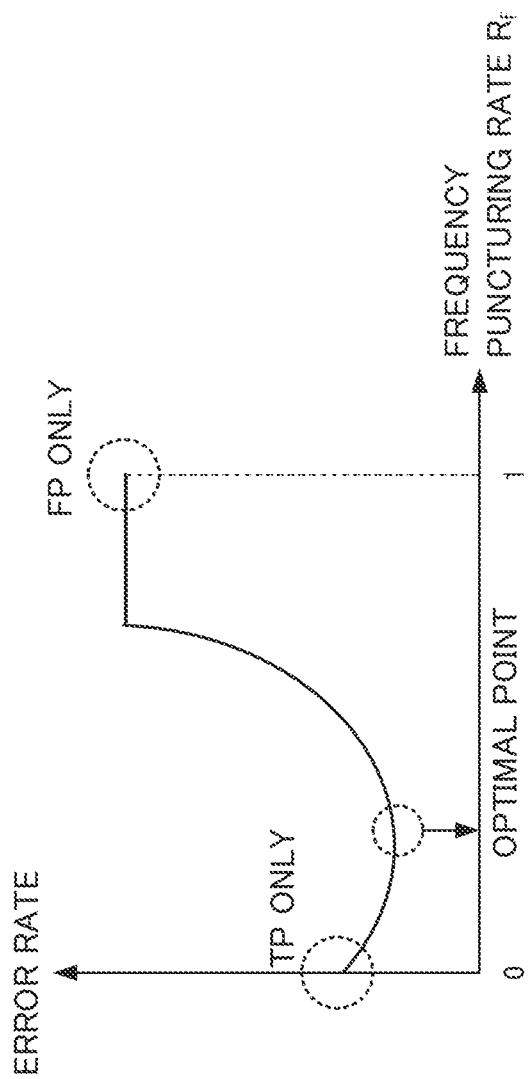
FIG. 8 illustrates a relationship between a frequency puncturing rate and an error rate according to Embodiment 1 of the present invention.

FIG. 8 illustrates a relationship between the frequency puncturing rate $R_f$ and the error rate. In FIG. 8, $R_f$=0 means that the frequency puncturing is not performed (i.e., only the time puncturing (TP) is performed) and $R_f$=1 means that only the frequency puncturing is performed.

If the total amount of puncturing $N_P$ is the same, as $R_f$ increases from $R_f$=0, as shown in FIG. 8, the coding gain increases more than inter-symbol interference (ISI) due to the frequency puncturing. Thus, as shown in FIG. 8, the error rate decreases (improves) from $R_f$=0 to a certain value (the optimal point). On the contrary, as shown in FIG. 8, when $R_f$ becomes larger than the optimal point, effects of the ISI exceed effects of the coding gain due to the frequency puncturing. That is, a degree of deterioration of the error rate due to an increase of the ISI exceeds a degree of improvement of the error rate due to an increase of the coding gain. In consequence, as shown in FIG. 8, when $R_f$ becomes larger than the optimal point, the error rate rises (deteriorates) sharply.

It is therefore desirable to control the frequency puncturing rate $R_f$ to be at or in the vicinity of the optimal point shown in FIG. 8.

The above-mentioned ISI may result from other causes than the frequency puncturing. The ISI may largely be caused by processing between the DFT (transmitting DFT) in transmission apparatus 100 (for example, a terminal) and the IDFT (receiving IDFT) in reception apparatus 200 (for example, a base station) and a distorted channel gain.

For example, one of the other causes of the ISI than the frequency puncturing relates to the number of drops in a propagation channel. For example, the number of drops in a propagation channel is represented by the number of subcarriers in which the channel gain becomes less than a predetermined value (hereinafter referred to as the number of dropped sub-carriers ($N_d$)).

Figures 9A, 9B:
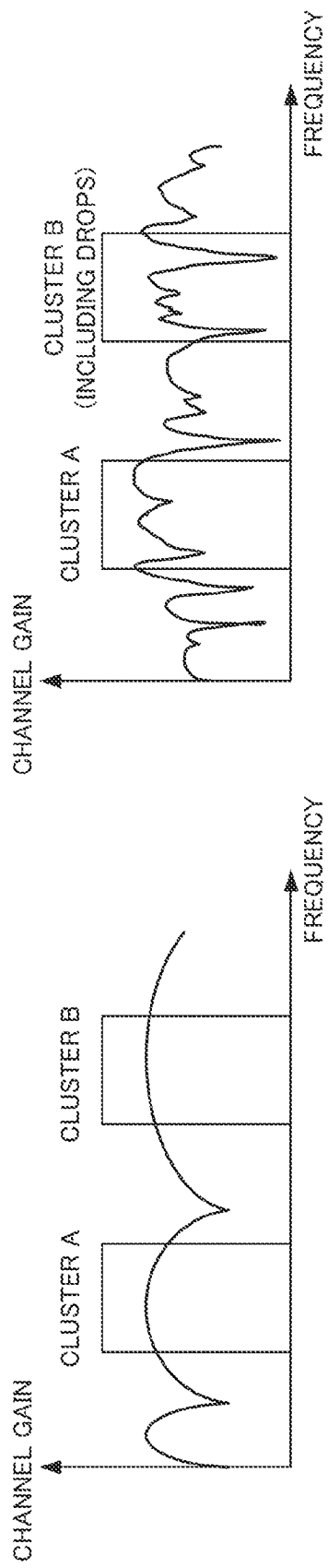
FIGS. 9A and 9B illustrate drops in the channel gain of a propagation channel.

For example, as shown in FIG. 9A, in a fading channel having a low frequency selectivity (a small delay spread), the number of dropped sub-carriers $N_d$ is small. Thus, as shown in FIG. 9A, in a fading channel having a low frequency selectivity, the channel gain is unlikely to drop in each cluster (cluster A or cluster B).

On the contrary, as shown in FIG. 9B, in a fading channel having a high frequency selectivity (a large delay spread), the number of dropped sub-carriers $N_d$ is large. Thus, as shown in FIG. 9B, in a fading channel having a high frequency selectivity, the channel gain is likely to drop in each cluster (cluster A or cluster B). In FIG. 9B, the channel gain drops in cluster B. In this way, in a fading channel (multipath fading channel) having a high frequency selectivity (a large delay spread), the effects of deterioration of the error performances caused by applying the frequency puncturing to clustered SC-FDMA become larger.

In consequence, as shown in FIGS. 10A to 10C, not only the frequency puncturing (see FIG. 10A), but also an increase in the number of dropped sub-carriers in a propagation channel (see FIG. 10B) causes the ISI (see FIG. 10C). In other words, as shown in FIG. 10C, performing the frequency puncturing means that the channel gain drops to nearly zero.

How to express the number of dropped sub-carriers $N_d$ will be described next.

For example, a delay spread ($\tau_{rms}$), which represents the magnitude of a frequency selectivity per unit bandwidth, and the number of allocated RBs $N_{PRB}$ (a cluster size), which represents the bandwidth to which encoded data (a plurality of clusters) are mapped, may be used to express the number of dropped sub-carriers $N_d$.

In particular, as the delay spread $\tau_{rms}$ increases, the frequency selectivity becomes higher (see FIG. 9B), and therefore the channel gain becomes more likely to drop in the clusters. That is, the number of dropped sub-carriers $N_d$ is larger for a larger delay spread $\tau_{rms}$. Thus, as shown in FIG. 11, when the delay spread $\tau_{rms}$ is large, it is preferable that transmission apparatus 100 does not apply the frequency puncturing and does apply only the time puncturing. On the contrary, as shown in FIG. 11, when the delay spread $\tau_{rms}$ is small (see FIG. 9A), it is preferable that transmission apparatus 100 applies the frequency puncturing.

In a multipath fading channel, as the number of allocated RBs $N_{PRB}$ increases (as the allocated bandwidth becomes wider), the channel gain becomes more likely to drop in the clusters. That is, as the number of allocated RBs $N_{PRB}$ increases (as the allocated bandwidth becomes wider), the number of dropped sub-carriers $N_d$ in the clusters becomes larger. Thus, as shown in FIG. 11, when the number of allocated RBs $N_{PRB}$ is large (the allocated bandwidth is wide), it is preferable that transmission apparatus 100 does not apply the frequency puncturing and does apply only the time puncturing. On the contrary, as shown in FIG. 11, when the number of allocated RBs $N_{PRB}$ is small (the allocated bandwidth is narrow), it is preferable that transmission apparatus 100 applies the frequency puncturing.

In consideration of the above, according to the present embodiment, transmission apparatus 100 controls the frequency puncturing, which is a cause of ISI, depending on the condition of a propagation channel (for example, an increase/decrease in the number of dropped sub-carriers represented by the delay spread or the number of allocated RBs), which is another cause of ISI. Transmission apparatus 100 may therefore decrease the frequency puncturing rate to suppress ISI due to the frequency puncturing when ISI due to the condition of a propagation channel is severe. Moreover, transmission apparatus 100 may increase the frequency puncturing rate to put priority on an increase in the coding gain in spite of occurrence of ISI due to the frequency puncturing when ISI due to the condition of a propagation channel is not severe.

A ratio of parity bits in data to be transmitted is higher for a lower code rate. This means that the coding gain obtained by coding processing is higher for a lower code rate. Thus, as shown in FIG. 11, it is preferable that transmission apparatus 100 puts priority on the application of time puncturing over the application of frequency puncturing when the code rate is low. On the contrary, as shown in FIG. 11, it is preferable that transmission apparatus 100 puts priority on the application of frequency puncturing when the code rate is high (the coding gain obtained by coding processing is low).

In consideration of the above, according to the present embodiment, transmission apparatus 100 may control the frequency puncturing depending on the code rate. Transmission apparatus 100 may therefore decrease the frequency puncturing rate to put priority on suppression of ISI over an increase in the coding gain due to the frequency puncturing when the code rate is low. Moreover, transmission apparatus 100 may increase the frequency puncturing rate to put priority on an increase in the coding gain due to the frequency puncturing when the code rate is high.

Operations of the transmission process in transmission apparatus 100 and the generation process of the feedback information in reception apparatus 200 according to the present embodiment will be described in detail below.

FIG. 12 shows an example of a frequency puncturing determination table that indicates the above-mentioned frequency puncturing determination rules.

The frequency puncturing determination table shown in FIG. 12 associates the MCS index (0-26), the number of allocated RBs $N_{PRB}$ (1-110), and the FP index (0, 1) with the frequency puncturing rate $R_f$. In other words, according to the frequency puncturing determination table shown in FIG. 12, the frequency puncturing rate $R_f$ is determined based on the MCS, the number of allocated RBs $N_{PRB}$, and the delay spread (FP index) of a propagation channel between reception apparatus 200 and transmission apparatus 100. More specifically, according to the frequency puncturing determination table shown in FIG. 12, one frequency puncturing rate $R_f$ is determined from among a plurality of candidates based on the MCS, the number of allocated RBs $N_{PRB}$, and the above-mentioned delay spread (FP index).

In FIG. 12, a modulation scheme corresponding to MCS indices 0-10 is QPSK, a modulation scheme corresponding to MCS indices 11-19 is 16-QAM, and a modulation scheme corresponding to MCS indices 20-26 is 64-QAM.

In FIG. 12, for the same modulation scheme, the larger the MCS index is, the higher the code rate is. For example, among MCS indices 0-10 corresponding to QPSK shown in FIG. 12, MCS index 10 corresponds to the highest code rate and MCS index 0 corresponds to the lowest code rate. The MCS indices corresponding to 16-QAM and 64-QAM shown in FIG. 12 are arranged in a similar way.

In FIG. 12, FP indices 0 and 1 are associated with two candidates of the frequency puncturing rate $R_f$, respectively. For example, in FIG. 12, for MCS index=10 and the number of allocated RBs $N_{PRB}$=110, FP index=0 is associated with a candidate of the frequency puncturing rate $R_f$ (0.5) and FP index=1 is associated with another candidate of the frequency puncturing rate $R_f$ (0.7). That is, for the same MCS index and the same number of allocated RBs $N_{PRB}$, FP index=0 corresponds to the lower frequency puncturing rate $R_f$ and FP index=1 corresponds to the higher frequency puncturing rate $R_f$.

Transmission apparatus 100 and reception apparatus 200 share the frequency puncturing determination table shown in FIG. 12.

The generation process of the feedback information in reception apparatus 200 will be described next.

Feedback information generation section 210 of reception apparatus 200 generates an FP index ($x_{fp}$) based on the delay spread $\tau_{rms}$ of a propagation channel between transmission apparatus 100 and reception apparatus 200. For example, feedback information generation section 210 generates FP index=1 when the delay spread $\tau_{rms}$ is less than a predetermined threshold $\tau_{th}$ according to expression 5. On the contrary, feedback information generation section 210 generates FP index=0 when the delay spread $\tau_{rms}$ is equal to or more than the predetermined threshold $\tau_{th}$ according to expression 5.

(Expression 5)

$$\begin{cases} \tau_{rms} < \tau_{th} \Rightarrow FP \text{ index} = 1(\text{Large Value}) \\ \tau_{rms} \geq \tau_{th} \Rightarrow FP \text{ index} = 0(\text{Small Value}) \end{cases} \quad [5]$$

That is, feedback information generation section 210 generates FP index=1 to indicate the higher frequency puncturing rate $R_f$ when the delay spread $\tau_{rms}$ is less than the predetermined threshold $\tau_{th}$ (i.e., when the number of dropped sub-carriers $N_d$ is expected to be small). On the contrary, feedback information generation section 210 generates FP index=0 to indicate the lower frequency puncturing rate $R_f$ when the delay spread $\tau_{rms}$ is equal to or more than the predetermined threshold $\tau_{th}$ (i.e., when the number of dropped sub-carriers $N_d$ is expected to be large).

A description will be provided for the case where MCS index=10 and the number of allocated RBs $N_{PRB}$=50 in FIG. 12, for example. In this case, as shown in FIG. 12, candidates of the frequency puncturing rate $R_f$ (a combination of frequency puncturing rates $C_{FP}$) are (0.6, 0.8). In this case, when the delay spread $\tau_{rms}$ is less than the threshold $\tau_{th}$, FP index=1 is generated, and the higher frequency puncturing rate $R_f$=0.8 is selected from the candidates $C_{FP}$ of the frequency puncturing rate $R_f$=(0.6, 0.8) according to expression 6. On the contrary, when the delay spread $\tau_{rms}$ is equal to or more than the threshold $\tau_{th}$, FP index=0 is generated, and the lower frequency puncturing rate $R_f$=0.6 is selected from the candidates $C_{FP}$ of the frequency puncturing rate $R_f$=(0.6, 0.8) according to expression 6.

(Expression 6)

$$\begin{cases} \tau_{rms} < \tau_{th} \Rightarrow 0.8(FP \text{ index} = 1) \\ \tau_{rms} \geq \tau_{th} \Rightarrow 0.6(FP \text{ index} = 0) \end{cases} \quad [6]$$

Reception apparatus 200 (feedback information generation section 210) then feeds back the generated FP index ($x_{fp}$) to transmission apparatus 100. It should be noted that in LTE-Advanced, as described above, reception apparatus 200 also feeds back the MCS index and the number of allocated RBs $N_{PRB}$ to transmission apparatus 100. Thus, in LTE-Advanced, for example, if transmission apparatus 100 and reception apparatus 200 share the frequency puncturing determination table shown in FIG. 12, only the FP index, which indicates a candidate of the frequency puncturing rate $R_f$, needs to be added to the feedback information.

A setting process of the amount of frequency puncturing and the amount of time puncturing in transmission apparatus 100 will be described next.

Feedback information demodulation section 110 of transmission apparatus 100 receives the feedback information (including the MCS index, the number of allocated RBs $N_{PRB}$, and the FP index ($x_{fp}$)) fed back from reception apparatus 200.

In control section 111, determination section 151 then determines the frequency puncturing rate $R_f$ based on the frequency puncturing determination table shown in FIG. 12 and the MCS index, the number of allocated RBs $N_{PRB}$, and the FP index ($x_{fp}$) fed back from reception apparatus 200.

A description will be provided for the case where MCS index=10, the number of allocated RBs $N_{PRB}$=50, and FP index $x_{fp}$=0, for example. In this case, determination section 151 determines the frequency puncturing rate $R_f$=0.6 in reference to the frequency puncturing determination table shown in FIG. 12.

As described above, determination section 151 also determines the TBS index based on the MCS index fed back from reception apparatus 200 in reference to the table shown in FIG. 2A. Determination section 151 further determines the TBS based on the determined TBS index and the number of allocated RBs $N_{PRB}$ fed back from reception apparatus 200 in reference to the table shown in FIG. 2B. With the use of the determined TBS, determination section 151 calculates the total amount of puncturing (herein denoted by $N_P$) according to expression 1, for example.

Then, setting section 152 of control section 111 sets the amount of frequency puncturing $N_f$ based on the total amount of puncturing $N_P$ and the frequency puncturing rate $R_f$ determined by determination section 151 according to expression 4. Setting section 152 also sets the amount of time puncturing $N_t$ based on the total amount of puncturing $N_P$ and the amount of frequency puncturing $N_f$ according to expression 4.

Figure 13:
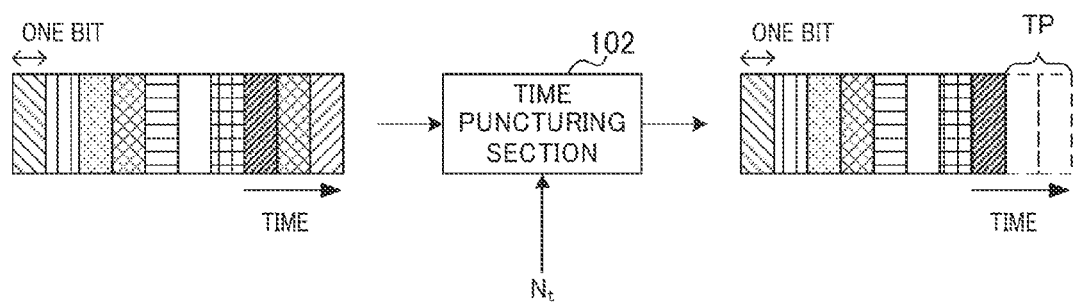
FIG. 13 illustrates an example of time puncturing processing according to Embodiment 1 of the present invention.

As shown in FIG. 13, time puncturing section 102 performs the time puncturing on encoded bits (ten bits, in FIG. 13) according to the amount of time puncturing $N_t$ (equivalent to two bits, in FIG. 13) set by setting section 152. In FIG. 13, time puncturing section 102 thins two bits from ten encoded bits to extract eight-bit encoded data.

Figure 14:
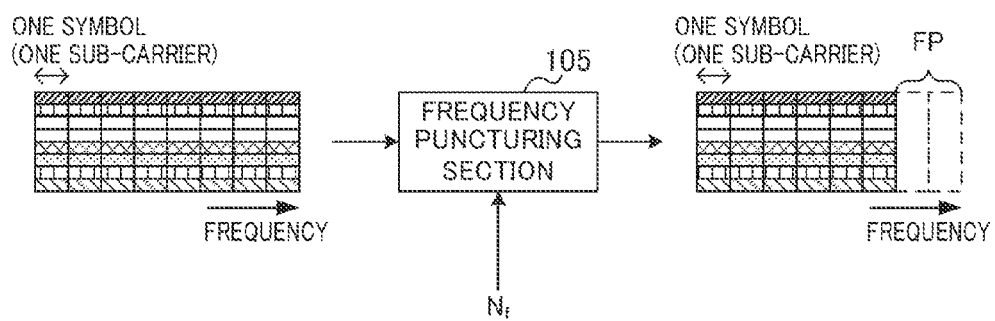
FIG. 14 illustrates an example of frequency puncturing processing according to Embodiment 1 of the present invention.

In addition, as shown in FIG. 14, frequency puncturing section 105 performs the frequency puncturing on modulated symbols (eight symbols, in FIG. 14) according to the amount of frequency puncturing $N_f$ (equivalent to two symbols, in FIG. 14) set by setting section 152. In FIG. 14, frequency puncturing section 105 thins out two symbols from eight modulated symbols to obtain six modulated symbols.

The characteristics of the frequency puncturing determination table (frequency puncturing determination rules) shown in FIG. 12 will be described next. As the characteristics, a "delay spread," "allocated bandwidth," "code rate," and "modulation level" will be described below.

<Delay Spread>

In the frequency puncturing determination table shown in FIG. 12, for the same MCS index and the same number of allocated RBs $N_{PRB}$, the larger the delay spread is, the lower the frequency puncturing rate $R_f$ is.

In particular, in the frequency puncturing determination table shown in FIG. 12, for the same MCS index and the same number of allocated RBs $N_{PRB}$, the frequency puncturing rate $R_f$ corresponding to FP index=0 (when the delay spread is large) is equal to or less than the frequency puncturing rate $R_f$ corresponding to FP index=1 (when the delay spread is small).

Transmission apparatus 100 therefore decreases the frequency puncturing rate $R_f$ when the delay spread is large (see FIG. 9B, for example) and thereby reduces occurrence of ISI due to the frequency puncturing. That is, transmission apparatus 100 suppresses occurrence of ISI due to the frequency puncturing among the causes of ISI shown in FIG. 10C when the delay spread is large (when ISI due to drops in the channel gain is severe) and thereby suppresses deterioration of the error rate performances.

On the contrary, transmission apparatus 100 increases the frequency puncturing rate $R_f$ when the delay spread is small (see FIG. 9A, for example). In other words, since ISI due to drops in the channel gain is not severe when the delay spread is small, transmission apparatus 100 puts priority on achieving a higher coding gain due to the frequency puncturing over suppressing occurrence of ISI due to the frequency puncturing to improve the error rate performances.

<Allocated Bandwidth (the Number of Allocated RBs $N_{PRB}$)>

In the frequency puncturing determination table shown in FIG. 12, for the same MCS index and the same FP index (the same delay spread), the larger the number of allocated RBs $N_{PRB}$ (the number of resources) is, the lower the frequency puncturing rate $R_f$ is.

A description will be provided for the case where MCS index=10 and FP index=0 in FIG. 12, for example. In this case, the frequency puncturing rate $R_f$=0.7 for the number of allocated RBs $N_{PRB}$=1, the frequency puncturing rate $R_f$=0.6 for the number of allocated RBs $N_{PRB}$=50, and the frequency puncturing rate $R_f$=0.5 for the number of allocated RBs $N_{PRB}$=110.

A description will also be provided for the case where MCS index=10 and FP index=1 in FIG. 12. In this case, the frequency puncturing rate $R_f$=0.9 for the number of allocated RBs $N_{PRB}$=1, the frequency puncturing rate $R_f$=0.8 for the number of allocated RBs $N_{PRB}$=50, and the frequency puncturing rate $R_f$=0.7 for the number of allocated RBs $N_{PRB}$=110.

As just described, for the same MCS index and the same FP index, the larger the number of allocated RBs $N_{PRB}$ is, the lower the frequency puncturing rate $R_f$ is. The same is true for the other combinations of the MCS index and the FP index in FIG. 12.

As described above, in a multipath fading channel, as the bandwidth that is allocated to data to be transmitted becomes wider (as the number of allocated RBs $N_{PRB}$ increases), the channel gain becomes more likely to drop in the allocated bands (in the clusters). In consequence, in a multipath fading channel, as the number of allocated RBs $N_{PRB}$ increases, more ISI due to drops in the channel gain occurs. In order to address this, in a multipath fading channel, transmission apparatus 100 decreases the frequency puncturing rate $R_f$ to reduce ISI due to the frequency puncturing when the number of allocated RBs $N_{PRB}$ is large. That is, transmission apparatus 100 suppresses the ISI due to the frequency puncturing among the causes of ISI shown in FIG. 10C when the number of allocated RBs $N_{PRB}$ is large, and thereby suppresses deterioration of the error rate performances.

On the contrary, transmission apparatus 100 increases the frequency puncturing rate $R_f$ when the number of allocated RBs $N_{PRB}$ is small. In other words, since ISI due to drops in the channel gain in the allocated bands (in the clusters) is not severe when the number of allocated RBs $N_{PRB}$ is small, transmission apparatus 100 puts priority on achieving a higher coding gain due to the frequency puncturing over suppressing occurrence of ISI due to the frequency puncturing to improve the error rate performances.

<Code Rate>

In the frequency puncturing determination table shown in FIG. 12, for the same modulation level, which is indicated by an MCS, the same number of allocated RBs $N_{PRB}$ (the same number of resources), and the same FP index (the same delay spread), the lower the code rate, which is indicated by the MCS, is, the lower the frequency puncturing rate $R_f$ is.

A description will be provided for the case where the modulation scheme indicated by the MCS is QPSK, the number of allocated RBs $N_{PRB}$=1, and FP index=0 in FIG. 12, for example. In this case, the frequency puncturing rate $R_f$=0.2 for the MCS index=0, the frequency puncturing rate $R_f$=0.3 for the MCS index=1, and the frequency puncturing rate $R_f$=0.7 for the MCS index=10.

A description will also be provided for the case where the modulation scheme indicated by the MCS is QPSK, the number of allocated RBs $N_{PRB}$=50, and FP index=0 in FIG. 12. In this case, the frequency puncturing rate $R_f$=0.1 for the MCS index=0, the frequency puncturing rate $R_f$=0.2 for the MCS index=1, and the frequency puncturing rate $R_f$=0.6 for the MCS index=10.

Thus, for the same modulation scheme, which is indicated by an MCS, the same number of allocated RBs $N_{PRB}$, and the same FP index, the lower the code rate, which is indicated by the MCS, is, the lower the frequency puncturing rate $R_f$ is. The same is true for the other combinations of the modulation scheme, the number of allocated RBs $N_{PRB}$, and the FP index in FIG. 12.

As described above, for a lower code rate, a ratio of parity bits in encoded data becomes higher, and therefore the coding gain becomes higher. Accordingly, when the code rate is low, a sufficient coding gain can be achieved. In consideration of the above, when the code rate is low, transmission apparatus 100 decreases the frequency puncturing rate $R_f$ to put priority on suppressing ISI due to the frequency puncturing over improving the coding gain due to the frequency puncturing, thereby suppressing deterioration of the error rate performances.

On the contrary, transmission apparatus 100 increases the frequency puncturing rate $R_f$ when the code rate is high. In other words, since a sufficient coding gain cannot be achieved when the code rate is high, transmission apparatus 100 improves the error rate performances by obtaining a higher coding gain by the frequency puncturing.

The code rate R expressed by expression 7 is an example of specific representations of the above-mentioned code rate used in the frequency puncturing determination table. According to expression 7, the code rate R represents a ratio of encoded bits after puncturing (($TBS/R_o$)–$N_P$: numerator) to encoded bits before puncturing ($TBS/R_o$: denominator). Accordingly, as the code rate R decreases, a ratio of punctured bits in the encoded bits becomes higher. Thus, as the code rate R decreases, the number of parity bits in the encoded bits becomes more likely to decrease, which results in a lower coding gain. In other words, as the code rate R increases, the number of parity bits in the encoded bits becomes more likely to increase, which results in a higher coding gain. It is therefore preferable that transmission apparatus 100 applies the frequency puncturing when the code rate R is low (when the number of parity bits in the encoded bits is small). In contrast, it is preferable that transmission apparatus 100 does not apply the frequency puncturing and does apply only the time puncturing when the code rate R is high (when the number of parity bits in the encoded bits is large). In short, when the code rate R expressed by expression 7 is used, transmission apparatus 100 and reception apparatus 200 may use a frequency puncturing determination rule that for the same modulation level, the same number of allocated RBs $N_{PRB}$ (the same number of resources), and the same FP index (the same delay spread), the higher the code rate R is, the lower the frequency puncturing rate $R_f$ is.

(Expression 7)

$$R = \frac{TBS/R_o - N_P}{TBS/R_o} \quad [7]$$

<Modulation Level>

In the frequency puncturing determination table shown in FIG. 12, for the same code rate, which is indicated by an MCS, the same number of allocated RBs $N_{PRB}$ (the same number of resources), and the same FP index (the same delay spread), the higher the modulation level (modulation scheme), which is indicated by the MCS, is, the lower the frequency puncturing rate $R_f$ is.

A description will be provided for the case where MCS index=10, 19, 26, each of which corresponds to the highest code rate indicated by the MCS, the number of allocated RBs $N_{PRB}$=1, and FP index=0 in FIG. 12, for example.

In this case, when the modulation scheme=QPSK (MCS index=10), the frequency puncturing rate $R_f$=0.7, when the modulation scheme=16-QAM (MCS index=19), the frequency puncturing rate $R_f$=0.6, and when the modulation scheme=64-QAM (MCS index=26), the frequency puncturing rate $R_f$=0.5.

Thus, for the same code rate, which is indicated by an MCS, the same number of allocated RBs $N_{PRB}$, and the same FP index, the higher the modulation level (modulation scheme), which is indicated by the MCS, is, the lower the frequency puncturing rate $R_f$ is. The same is true for the other combinations of the code rate, the number of allocated RBs $N_{PRB}$, and the FP index in FIG. 12.

At a higher modulation level, distances between constellation points, to which bits are mapped, are shorter and therefore resilience to interference is more likely to decrease, which results in deterioration of the error rate performances. In order to address this, transmission apparatus 100 decreases the frequency puncturing rate $R_f$ to suppress occurrence of ISI due to the frequency puncturing when the modulation level is high. In other words, when the modulation level is high, transmission apparatus 100 puts priority on suppressing ISI due to the frequency puncturing over improving the coding gain due to the frequency puncturing to suppress deterioration of the error rate performances.

On the contrary, transmission apparatus 100 increases the frequency puncturing rate $R_f$ when the modulation level is low. That is, transmission apparatus 100 improves the error rate performances by obtaining a higher coding gain due to the frequency puncturing when the modulation level is low.

The characteristics of the frequency puncturing determination table shown in FIG. 12 have been described above.

Figure 15:
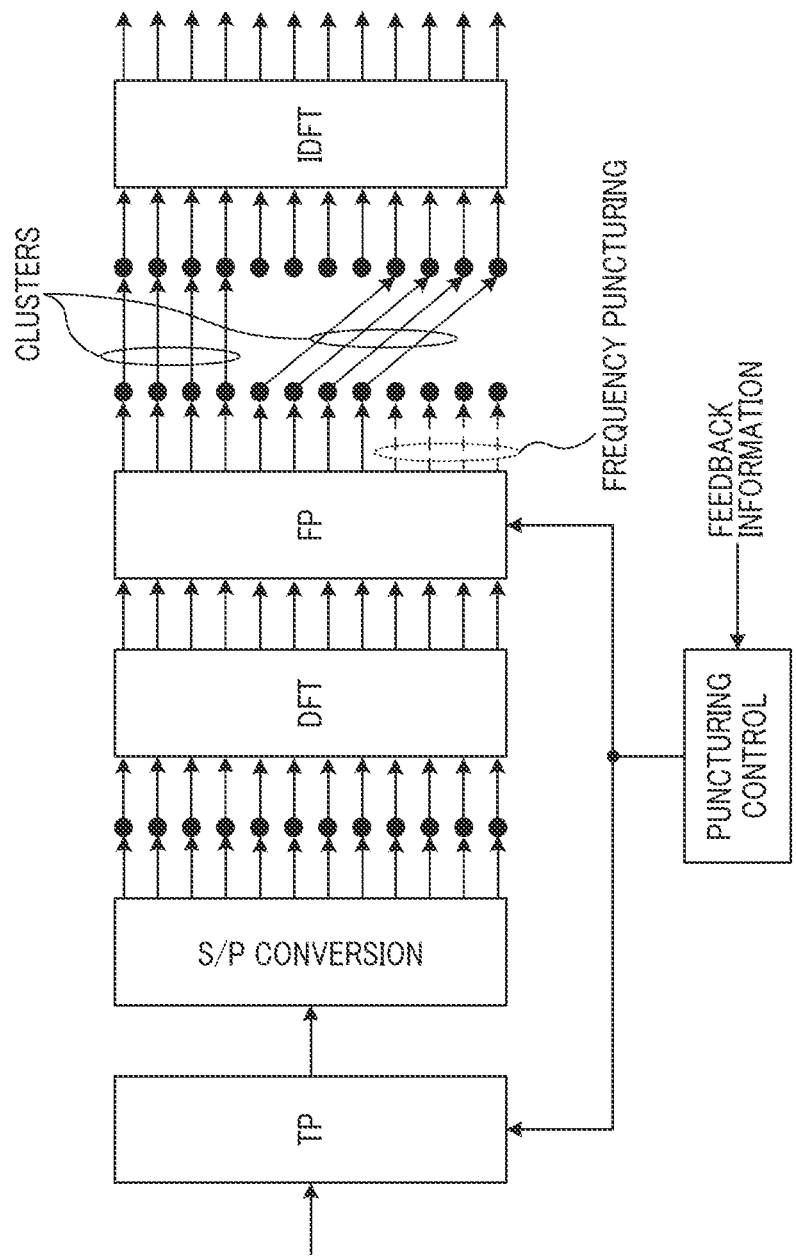
FIG. 15 illustrates clustered SC-FDMA to which the frequency puncturing is applied according to Embodiment 1 of the present invention.

As described above, transmission apparatus 100 controls both kinds of puncturing, the time puncturing (TP) and the frequency puncturing (FP), based on the feedback information from reception apparatus 200 (see FIG. 15). In particular, transmission apparatus 100 determines a ratio between the amount of time puncturing and the amount of frequency puncturing in the total amount of puncturing (a frequency puncturing rate is used herein) based on puncturing determination rules (a frequency puncturing determination table is used herein). According to the puncturing determination rules, a ratio between the amount of time puncturing and the amount of frequency puncturing (a frequency puncturing rate) is determined based on an MCS (a code rate and a modulation level) for the encoded data, the number of resources allocated to the encoded data, and a delay spread of a propagation channel between reception apparatus 200 and transmission apparatus 100.

In the puncturing determination table shown in FIG. 12, the frequency puncturing rate is set in consideration of an increase/decrease in ISI due to drops in the channel gain of a propagation channel, which are represented by the delay spread, for example. Thus, according to the present embodiment, when the frequency puncturing is applied to clustered SC-FDMA, transmission apparatus 100 determines the frequency puncturing rate in consideration of causes of ISI (the channel gain of a propagation channel being less than a predetermined threshold is used as an example herein) in a multipath fading channel.

This enables transmission apparatus 100 to perform the frequency puncturing with a suitable frequency puncturing rate (i.e., a ratio between the amount of time puncturing and the amount of frequency puncturing) for the varying condition of a propagation channel (the magnitude of the delay spread). Transmission apparatus 100 therefore decreases the frequency puncturing rate to put priority on suppressing ISI over improving the coding gain when the channel gain of a propagation channel drops frequently. On the contrary, transmission apparatus 100 increases the frequency puncturing rate to put priority on improving the coding gain over suppressing ISI when the channel gain of a propagation channel does not drop frequently.

According to the present embodiment, good error rate performances can therefore be achieved in any propagation channel.

According to the present embodiment, in clustered SC-FDMA to which the frequency puncturing is applied, the FP index is used as feedback information from reception apparatus 200 for determining the frequency puncturing. In consequence, in LTE-Advanced, when the frequency puncturing determination table shown in FIG. 12 is used, reception apparatus 200 may provide the one-bit FP index (0 or 1) as the only new feedback information to transmission apparatus 100. In this way, according to the present embodiment, as compared to LTE-Advanced, better error rate performances can be achieved with minimum additional signaling for determining the frequency puncturing rate.

Embodiment 2

A description will also be provided for the case where the frequency puncturing rate is set depending on the number of clusters that are allocated to a transmission apparatus (the number of allocated clusters, hereinafter denoted by $N_C$), according to the present embodiment.

Reception apparatus 200 (FIG. 7) performs demodulation processing on clusters transmitted from transmission apparatus 100 (FIG. 6) based on channel estimation values derived by means of DMRSs, for example. These DMRSs are mapped to frequency bands allocated to the clusters. Moreover, reception apparatus 200 estimates a channel estimation value (for example, SINR) for each frequency band (sub-carrier) by using three sub-carriers, i.e., the channel estimation target sub-carrier and two nearest sub-carriers on both sides of the channel estimation target sub-carrier, for example. When the channel of a sub-carrier located at the outer end of a cluster is to be estimated, reception apparatus 200 cannot use one of the nearest sub-carriers (the sub-carrier to which no DMRS is mapped) on both sides of the channel estimation target sub-carrier.

Figure 16A:
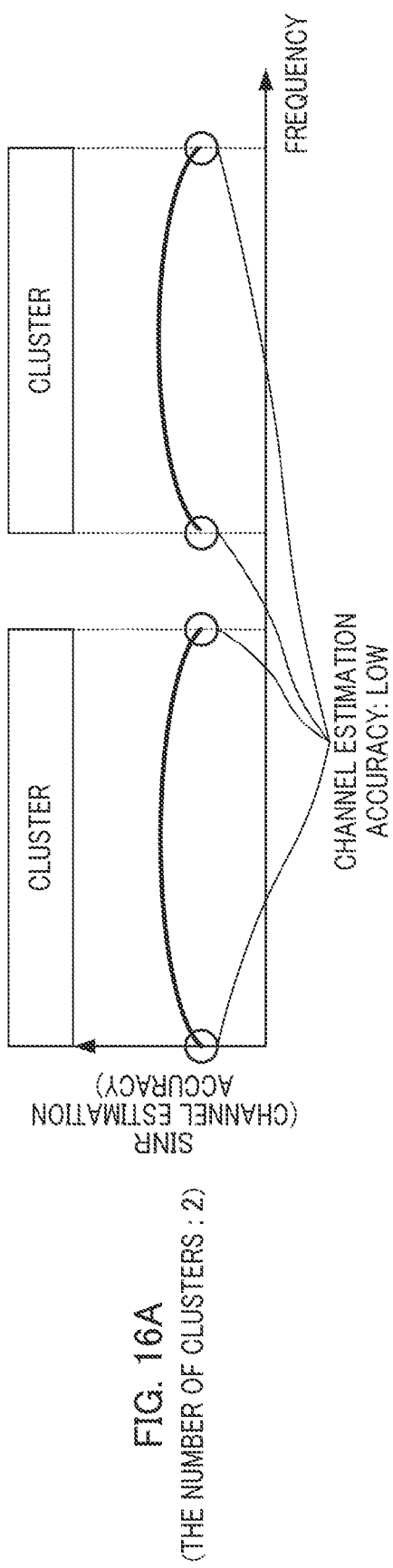
FIGS. 16A and 16B illustrate channel estimation accuracy corresponding to the number of allocated clusters according to Embodiment 2 of the present invention.
Figure 16B:
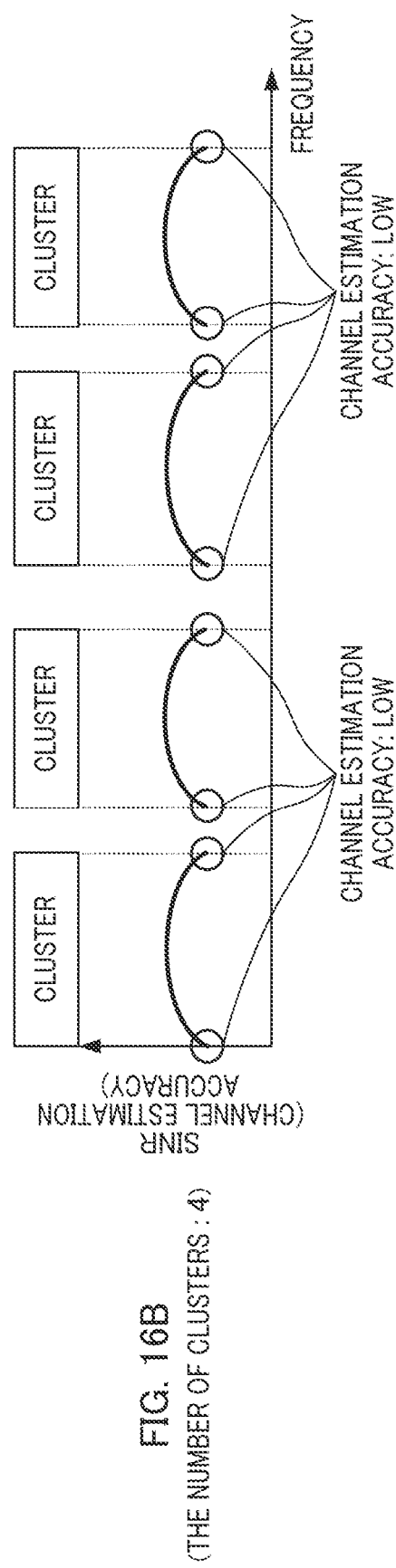

Thus, as shown in FIG. 16A and FIG. 16B, the channel estimation is accurate in frequencies around the center of each cluster, while the channel estimation is inaccurate around both outer ends of the cluster.

As can be seen by comparing FIG. 16A with FIG. 16B, in the case where the number of clusters is large (FIG. 16B), the number of sub-carriers located at the outer ends of the clusters is also large and therefore the channel estimation accuracy deteriorates for a larger number of sub-carriers as compared to the case where the number of allocated clusters is small (FIG. 16A). In short, as the number of allocated clusters increases, more ISI occurs.

In consideration of the above, according to the present embodiment, the frequency puncturing rate (a ratio between the amount of time puncturing and the amount of frequency puncturing) is changed depending on the number of allocated clusters $N_C$ of transmission apparatus 100.

In particular, transmission apparatus 100 and reception apparatus 200 share two rules: a frequency puncturing determination rule used when the number of allocated clusters $N_C$ of transmission apparatus 100 is large; and a frequency puncturing determination rule used when the number of allocated clusters $N_C$ specified for transmission apparatus 100 is small.

More specifically, in transmission apparatus 100, determination section 151 of control section 111 (FIG. 6) determines the frequency puncturing rate $R_f$ based on the frequency puncturing determination rule used when the number of allocated clusters $N_C$ is large and the puncturing determination rule used when the number of allocated clusters $N_C$ is small.

FIG. 17 shows a frequency puncturing determination table that represents the frequency puncturing determination rule used when the number of allocated clusters $N_C$ is small, and FIG. 12 shows a frequency puncturing determination table that represents the frequency puncturing determination rule used when the number of allocated clusters $N_C$ is large.

As in Embodiment 1, according to the two frequency puncturing determination tables shown in FIG. 17 and FIG. 12, the frequency puncturing rate $R_f$ is determined based on an MCS, the number of allocated RBs $N_{PRB}$, and a delay spread of a propagation channel between reception apparatus 200 and transmission apparatus 100.

However, as can be seen by comparing FIG. 17 with FIG. 12, for the same MCS, the same number of allocated RBs $N_{PRB}$ (the same number of resources), and the same FP index (the same delay spread), the frequency puncturing $R_f$ determined according to the frequency puncturing determination table used when the number of allocated clusters $N_C$ is large (FIG. 12) is less than that determined according to the frequency puncturing determination table used when the number of allocated clusters $N_C$ is small (FIG. 17).

A description will be provided for the case where MCS index=10, the number of allocated RBs $N_{PRB}$=50, and FP index=0, for example. In this case, according to the frequency puncturing determination table used when the number of allocated clusters $N_C$ is small (FIG. 17), the frequency puncturing rate $R_f$ is 0.7. In contrast, according to the frequency puncturing determination table used when the number of allocated clusters $N_C$ is large (FIG. 12), the frequency puncturing rate $R_f$ is 0.6.

A description will also be provided for the case where MCS index=10, the number of allocated RBs $N_{PRB}$=50, and FP index=1. In this case, according to the frequency puncturing determination table used when the number of allocated clusters $N_C$ is small (FIG. 17), the frequency puncturing rate $R_f$ is 0.9. In contrast, according to the frequency puncturing determination table used when the number of allocated clusters $N_C$ is large (FIG. 12), the frequency puncturing rate $R_f$ is 0.8.

As just described, for the same MCS index, the number of allocated RBs $N_{PRB}$, and the same FP index, the larger the number of allocated clusters $N_C$ is, the lower the frequency puncturing rate $R_f$ is. The same is true for the other combinations of the MCS index, the number of allocated RBs $N_{PRB}$, and the FP index in FIG. 12 and FIG. 17.

Transmission apparatus 100 can switch the frequency puncturing determination tables (FIG. 12 and FIG. 17) depending on the number of allocated clusters $N_C$, for example. For example, transmission apparatus 100 compares the number of allocated clusters $N_C$ to a predetermined threshold. If the number of allocated clusters $N_C$ is equal to or more than the threshold, then, transmission apparatus 100 uses the frequency puncturing determination table shown in FIG. 12, and otherwise, if the number of allocated clusters $N_C$ is less than the threshold, then, transmission apparatus 100 uses the frequency puncturing determination table shown in FIG. 17.

As a result, transmission apparatus 100 can determine a suitable frequency puncturing rate $R_f$ according to the severity of ISI that depends on the number of allocated clusters $N_C$ (see FIG. 16A and FIG. 16B).

Thus, when the number of allocated clusters $N_C$ is large (FIG. 16B), transmission apparatus 100 suppresses ISI due to the frequency puncturing to suppress deterioration of the error rate performances. In contrast, when the number of allocated clusters $N_C$ is small (FIG. 16A), transmission apparatus 100 utilizes a higher coding gain due to the frequency puncturing to improve the error rate performances.

Accordingly, transmission apparatus 100 can perform the frequency puncturing with a suitable frequency puncturing rate (i.e., a ratio between the amount of time puncturing and the amount of frequency puncturing) not only for the varying condition of a propagation channel (the magnitude of the delay spread), but also for the number of allocated clusters of transmission apparatus 100, according to the present embodiment. According to the present embodiment, good error rate performances can therefore be achieved in any propagation channel and for any number of allocated clusters.

Embodiment 3

A description will also be provided for the case where the frequency puncturing rate is set depending on the number of antennas used by a reception apparatus according to the present embodiment.

FIG. 18A illustrates the channel gain when reception apparatus 200 (FIG. 7) receives a signal from transmission apparatus 100 (FIG. 6) via one receiving antenna (i.e., single-antenna reception). In contrast, FIG. 18B illustrates the channel gain after antenna combining when reception apparatus 200 receives a signal from transmission apparatus 100 via a plurality of receiving antennas (the number of receiving antennas 2) (i.e., multi-antenna reception, or antenna-diversity reception).

As can be seen by comparing FIG. 18A with FIG. 18B, the channel gain after antenna combining obtained by multi-antenna reception shown in FIG. 18B results in a smaller number of dropped sub-carriers which may cause ISI than the channel gain obtained by single-antenna reception shown in FIG. 18A. This means that the multi-antenna reception can reduce ISI as compared to the single-antenna reception.

In consideration of the above, according to the present embodiment, the frequency puncturing rate (i.e., a ratio between the amount of time puncturing and the amount of frequency puncturing) is changed depending on the number of receiving antennas used by reception apparatus 200.

In particular, transmission apparatus 100 and reception apparatus 200 share two rules: a frequency puncturing determination rule used when the number of receiving antennas used by reception apparatus 200 is large (for example, more than one); and a frequency puncturing determination rule used when the number of receiving antennas used by reception apparatus 200 is small (for example, one).

More specifically, in transmission apparatus 100, determination section 151 of control section 111 (FIG. 6) determines the frequency puncturing rate $R_f$ based on the frequency puncturing determination rule used when the number of receiving antennas used by reception apparatus 200 is large and the puncturing determination rule used when the number of receiving antennas used by reception apparatus 200 is small.

FIG. 17 shows a frequency puncturing determination table that represents the frequency puncturing determination rule used when the number of receiving antennas used by reception apparatus 200 is large, and FIG. 12 shows a frequency puncturing determination table that represents the frequency puncturing determination rule used when the number of receiving antennas used by reception apparatus 200 is small.

As in Embodiment 1, according to the two frequency puncturing determination tables shown in FIG. 17 and FIG. 12, the frequency puncturing rate $R_f$ is determined based on an MCS, the number of allocated RBs $N_{PRB}$, and a delay spread of a propagation channel between reception apparatus 200 and transmission apparatus 100.

However, as in Embodiment 2, as can be seen by comparing FIG. 17 with FIG. 12, for the same MCS, the same number of allocated RBs $N_{PRB}$ (the same number of resources), and the same FP index (the same delay spread), the frequency puncturing $R_f$ determined according to the frequency puncturing determination table used when the number of receiving antennas used by reception apparatus 200 is small (FIG. 12) is less than that determined according to the frequency puncturing determination table used when the number of receiving antennas used by reception apparatus 200 is large (FIG. 17).

Transmission apparatus 100 can switch the frequency puncturing determination tables (FIG. 12 and FIG. 17) depending on the number of receiving antennas used by reception apparatus 200, for example. For example, if the number of receiving antennas used by reception apparatus 200 is small, transmission apparatus 100 uses the frequency puncturing determination table shown in FIG. 12, and otherwise, if the number of receiving antennas used by reception apparatus 200 is large, transmission apparatus 100 uses the frequency puncturing determination table shown in FIG. 17.

As a result, transmission apparatus 100 can determine a suitable frequency puncturing rate $R_f$ according to the severity of ISI that depends on the number of receiving antennas of reception apparatus 200 (see FIG. 18A and FIG. 18B).

More specifically, when the number of receiving antennas used by reception apparatus 200 is small (FIG. 18A), transmission apparatus 100 suppresses ISI due to the frequency puncturing to suppress deterioration of the error rate performances. In contrast, when the number of receiving antennas used by reception apparatus 200 is large (FIG. 18B), transmission apparatus 100 utilizes a higher coding gain due to the frequency puncturing to improve the error rate performances.

Accordingly, transmission apparatus 100 can perform the frequency puncturing with a suitable frequency puncturing rate (i.e., a ratio between the amount of time puncturing and the amount of frequency puncturing) not only for the varying condition of a propagation channel (the magnitude of the delay spread), but also for the number of receiving antennas of reception apparatus 200 according to the present embodiment. According to the present embodiment, good error rate performances can therefore be achieved in any propagation channel and for any number of receiving antennas.

In the present embodiment, the number of receiving antennas of reception apparatus 200 may be fixed or may be dynamically changed depending on the situation. When the number of receiving antennas of reception apparatus 200 is fixed, reception apparatus 200 needs to have only the frequency puncturing determination table corresponding to the fixed number of receiving antennas. In contrast, when the number of receiving antennas of reception apparatus 200 is dynamically changed, reception apparatus 200 can have a plurality of frequency puncturing determination tables corresponding to the different numbers of receiving antennas, and switch the frequency puncturing determination tables depending on the number of receiving antennas that are actually used.

A description has been provided on how the frequency puncturing rate is determined based on the number of receiving antennas of reception apparatus 200 according to the present embodiment. In other words, a description has been provided for the case of receiving antenna diversity as an example of diversity. However, the present embodiment may be used for the number of transmitting antennas of transmission apparatus 100 (transmitting antenna diversity). In this case, especially in the eigenmode transmission scheme, transmission apparatus 100 needs to set different frequency puncturing rates for respective layers because channels vary differently in different layers.

The embodiments of the present invention have been described above.

In the above-described embodiments, the number of sub-carriers in which the channel gain becomes equal to or less than a certain threshold in cluster-allocated bands may be used instead of the delay spread (the magnitude of frequency selectivity per unit bandwidth). Alternatively, the number of sub-carriers in which the channel gain becomes equal to or less than a certain threshold in all bands may be used instead of the delay spread.

A description has been provided for the case where the ratio of the amount of frequency puncturing to the total amount of puncturing (the frequency puncturing rate) is set in the frequency puncturing determination table shown in FIG. 12 or FIG. 17, according to the above-described embodiments. However, the number of symbols to be thinned out (or the amount of electric power to be thinned out) by the frequency puncturing, instead of the frequency puncturing rate, may be set in the frequency puncturing determination table, for example.

Although a description has been provided for the case where candidates of the frequency puncturing rate are set in pair as shown in FIG. 12 and FIG. 17, and the FP index can have one of two values (one bit), i.e., (0, 1) in the above-described embodiments, the embodiments are not limited to this case. For example, four candidates of the frequency puncturing rate may be set, and the FP index may have one of four values (two bits), i.e., (0-3).

A description has been provided for the case where the number of dropped sub-carriers, the delay spread, the number of allocated clusters, and the number of receiving antennas are used as indicators of causes of signal (transmitted signal or received signal) distortion between the transmitting DFT and the receiving IDFT, according to the above-described embodiments. However, any other parameters that indicate causes of signal distortion between the transmitting DFT and the receiving IDFT may be used as the above-mentioned indicators.

In the embodiments described above, the present invention is configured with hardware by way of example, but the invention may also be provided by software in concert with hardware.

In addition, the functional blocks used in the descriptions of the embodiments are typically implemented as LSI devices, which are integrated circuits. The functional blocks may be formed as individual chips, or a part or all of the functional blocks may be integrated into a single chip. The term "LSI" is used herein, but the terms "IC," "system LSI," "super LSI" or "ultra LSI" may be used as well depending on the level of integration.

In addition, the circuit integration is not limited to LSI and may be achieved by dedicated circuitry or a general-purpose processor other than an LSI. After fabrication of LSI, a field programmable gate array (FPGA), which is programmable, or a reconfigurable processor which allows reconfiguration of connections and settings of circuit cells in LSI may be used.

Should a circuit integration technology replacing LSI appear as a result of advancements in semiconductor technology or other technologies derived from the technology, the functional blocks could be integrated using such a technology. Another possibility is the application of biotechnology and/or the like.

The disclosure of the specification, drawings, and abstract included in Japanese Patent Application No. 2011-186911, filed on Aug. 30, 2011 is incorporated herein by reference in its entirety.

INDUSTRIAL APPLICABILITY

The present invention is suitable for use in mobile communication systems, for example.

REFERENCE SIGNS LIST

100 Transmission apparatus
101 Coding section
102 Time puncturing section
103 Modulation section
104, 203 DFT section
105 Frequency puncturing section
106 Mapping section
107, 207 IDFT section
108 CP adding section
109, 201 Antenna
110 Feedback information demodulation section
111 Control section
151 Determination section
152 Setting section
200 Reception apparatus
202 CP removing section
204 Channel estimation section
205 Frequency equalization section
206 Demapping section
208 Demodulation section
209 Decoding section
210 Feedback information generation section

The invention claimed is:

1. A transmission apparatus that performs time puncturing and frequency puncturing, the time puncturing being performed on bits of encoded data on a per bit basis in a time domain, the frequency puncturing being performed, on a per symbol basis, on the encoded data in which bits are convoluted into a plurality of symbols in a frequency domain, the transmission apparatus comprising:
a determination section that determines, according to a puncturing determination rule, a ratio between a first amount of electric power corresponding to a bit that is punctured by the time puncturing and a second amount of electric power corresponding to a symbol that is punctured by the frequency puncturing in a total amount of electric power corresponding to components of the encoded data, the components being punctured by the time puncturing and the frequency puncturing;
a setting section that sets the first amount of electric power and the second amount of electric power based on the ratio;
a first puncturing section that performs the time puncturing on the encoded data according to the first amount of electric power; and
a second puncturing section that performs the frequency puncturing on the encoded data after the time puncturing, according to the second amount of electric power, wherein
the ratio is identified according to the puncturing determination rule based on an MCS (Modulation and Coding Scheme) for the encoded data, a number of resources allocated to the encoded data, and a delay spread of a propagation channel between a reception apparatus and the transmission apparatus.

2. The transmission apparatus according to claim 1, wherein one ratio is identified from among a plurality of candidates of the ratio based on the MCS, the number of resources, and the delay spread according to the puncturing determination rule.

3. The transmission apparatus according to claim 1, wherein:
the determination section determines a frequency puncturing rate according to the puncturing determination rule, the frequency puncturing rate being a ratio of the second amount of electric power to the total amount of electric power that is a sum of the first amount of electric power and the second amount of electric power; and
the setting section sets the first amount of electric power and the second amount of electric power based on the frequency puncturing rate.

4. The transmission apparatus according to claim 3, wherein:
the determination section determines the frequency puncturing rate based on a first puncturing determination rule that is used when the number of antennas of the reception apparatus is small and a second puncturing determination rule that is used when the number of antennas of the reception apparatus is large; and
for the same MCS, the same number of resources, and the same delay spread, the frequency puncturing rate determined according to the first puncturing determination rule is less than the frequency puncturing rate determined according to the second puncturing determination rule.

5. The transmission apparatus according to claim 3, wherein:
the transmission apparatus generates a plurality of clusters by dividing a plurality of symbols in the frequency domain that are included in the encoded data into the plurality of clusters;
the determination section determines the frequency puncturing rate based on a first puncturing determination rule used when a number of the clusters is large and a second puncturing determination rule used when the number of the clusters is small; and
for the same MCS, the same number of resources, and the same delay spread, the frequency puncturing rate determined according to the first puncturing determination rule is less than the frequency puncturing rate determined according to the second puncturing determination rule.

6. The transmission apparatus according to claim 1, wherein, for the same MCS and the same number of resources, the larger the delay spread is, the lower the frequency puncturing rate is, according to the puncturing determination rule.

7. The transmission apparatus according to claim 6, further comprising a receiving section that receives feedback information, from the reception apparatus, feedback information generated based on the delay spread, wherein:
the determination section determines the frequency puncturing rate by using the puncturing determination rule and the feedback information; and
the feedback information indicates one frequency puncturing rate selected from among a plurality of candidates of the frequency puncturing rate depending on a magnitude of the delay spread for the same MCS and the same number of resources.

8. The transmission apparatus according to claim 1, wherein, for the same MCS and the same delay spread, the larger the number of resources is, the lower the frequency puncturing rate is, according to the puncturing determination rule.

9. The transmission apparatus according to claim 1, wherein, for the same modulation level indicated by the MCS, the same number of resources, and the same delay spread, the lower the code rate indicated by the MCS is, the lower the frequency puncturing rate is, according to the puncturing determination rule.

10. The transmission apparatus according to claim 1, wherein, for the same code rate indicated by the MCS, the same number of resources, and the same delay spread, the higher the modulation level indicated by the MCS is, the lower the frequency puncturing rate is, according to the puncturing determination rule.

11. The transmission apparatus according to claim 1, wherein the transmission apparatus and the reception apparatus share the puncturing determination rule.

12. A transmission method in which time puncturing and frequency puncturing are performed, the time puncturing being performed on bits of encoded data on a per bit basis in a time domain, the frequency puncturing being performed, on a per symbol basis, on the encoded data in which bits are convoluted into a plurality of symbols in a frequency domain, the transmission method comprising:
determining, according to a puncturing determination rule, a ratio between a first amount of electric power corresponding to a bit that is punctured by the time puncturing and a second amount of electric power corresponding to a symbol that is punctured by the frequency puncturing in a total amount of electric power corresponding to components of the encoded data, the components being punctured by the time puncturing and the frequency puncturing;
setting the first amount of electric power and the second amount of electric power based on the ratio;
performing the time puncturing on the encoded data according to the first amount of electric power; and
performing the frequency puncturing on the encoded data after the time puncturing, according to the second amount of electric power, wherein
the ratio is determined according to the puncturing determination rule based on an MCS (Modulation and Coding Scheme) for the encoded data, a number of resources allocated to the encoded data, and a delay spread of a propagation channel between a reception apparatus and a transmission apparatus.

* * * * *